(12) United States Patent
Oh et al.

(10) Patent No.: US 10,840,317 B2
(45) Date of Patent: Nov. 17, 2020

(54) DISPLAY APPARATUS AND METHOD OF MANUFACTURING THE SAME

(71) Applicant: Samsung Display Co., Ltd., Yongin-si (KR)

(72) Inventors: Eonseok Oh, Yongin-si (KR); Woosik Jeon, Yongin-si (KR); Sangyeol Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/737,514

(22) Filed: Jan. 8, 2020

(65) Prior Publication Data

US 2020/0273927 A1 Aug. 27, 2020

(30) Foreign Application Priority Data

Feb. 21, 2019 (KR) .................. 10-2019-0020494

(51) Int. Cl.
*H01L 27/32* (2006.01)
*H01L 51/00* (2006.01)
*H01L 51/56* (2006.01)

(52) U.S. Cl.
CPC ........ *H01L 27/3248* (2013.01); *H01L 27/326* (2013.01); *H01L 27/3258* (2013.01); *H01L 51/0016* (2013.01); *H01L 51/0096* (2013.01); *H01L 51/56* (2013.01)

(58) Field of Classification Search
CPC ............. H01L 27/3248; H01L 27/3258; H01L 27/326; H01L 51/0016; H01L 51/0096; H01L 51/56
See application file for complete search history.

(56) References Cited

U.S. PATENT DOCUMENTS

| | | | |
|---|---|---|---|
| 10,044,002 B2 | 8/2018 | Lee et al. | |
| 10,691,913 B2 * | 6/2020 | Chai | G06K 9/2036 |
| 10,692,300 B2 * | 6/2020 | Kawamoto | G09G 5/14 |
| 2017/0256747 A1 | 9/2017 | Lee et al. | |
| 2018/0069063 A1 | 3/2018 | Kim et al. | |

FOREIGN PATENT DOCUMENTS

| | | |
|---|---|---|
| KR | 10-1483193 B1 | 1/2015 |
| KR | 10-2016-0057197 A | 5/2016 |
| KR | 10-2017-0088457 A | 8/2017 |
| KR | 10-2017-0104097 A | 9/2017 |
| KR | 10-2018-0026599 A | 3/2018 |

* cited by examiner

*Primary Examiner* — Andrew Q Tran

(74) *Attorney, Agent, or Firm* — Lewis Roca Rothgerber Christie LLP

(57) ABSTRACT

A display apparatus includes a substrate including a display area and a sensor area, the display area including main pixels and the sensor area including auxiliary pixels and a transmission portion; a first pixel electrode and a first emission layer in each of the main pixels; a second pixel electrode and a second emission layer in each of the auxiliary pixels; an opposite electrode integrally arranged in the display area and the sensor area; and a metal layer at least partially surrounding the transmission portion, wherein the opposite electrode has an opening corresponding to the transmission portion.

20 Claims, 19 Drawing Sheets

DISPLAY APPARATUS AND METHOD OF MANUFACTURING THE SAME

CROSS-REFERENCE TO RELATED APPLICATION

This application claims priority to and the benefit of Korean Patent Application No. 10-2019-0020494 filed on Feb. 21, 2019 in the Korean Intellectual Property Office (KIPO), the entire disclosure of which is incorporated herein by reference.

BACKGROUND

1. Field

One or more embodiments relate to a display apparatus and a method of manufacturing the display apparatus.

2. Description of the Related Art

Display apparatuses have been used for various purposes. Also, because the thickness and weight of the display apparatuses have been reduced, a utilization range of the display apparatuses has increased.

According to use of the display apparatuses, different methods of designing a shape thereof have been developed and more functions have been embedded in or linked to the display apparatuses.

SUMMARY

Aspects of one or more embodiments are directed toward a display apparatus including a sensor area, in which a sensor, etc., is arranged, inside a display area. However, the above technical feature is exemplary and the scope of the present disclosure is not limited thereto.

Additional aspects of one or more embodiments will be set forth in part in the description which follows and, in part, will be apparent from the description, or may be learned by practice of the presented embodiments.

According to one or more embodiments, a display apparatus includes: a substrate including a display area and a sensor area, wherein the display area includes main pixels and the sensor area includes auxiliary pixels and a transmission portion; a first pixel electrode and a first emission layer in each of the main pixels; a second pixel electrode and a second emission layer in each of the auxiliary pixels; an opposite electrode integrally arranged in the display area and the sensor area; and a metal layer at least partially surrounding the transmission portion, wherein the opposite electrode has an opening corresponding to the transmission portion.

The display apparatus may further include: an inorganic insulating layer on the substrate, wherein the inorganic insulating layer has a first hole corresponding to the transmission portion, and the opposite electrode may be on a side wall of the first hole.

The metal layer may be in the first hole.

The opening in the opposite electrode may have an area that is less than an area of the first hole.

The display apparatus may further include: a functional layer integrally provided in the display area and the sensor area, the functional layer being between the first pixel electrode and the opposite electrode and having an opening corresponding to the transmission portion, wherein the opening of the opposite electrode and the opening of the functional layer may overlap each other and form a through hole.

The metal layer may include same material as the first pixel electrode.

The metal layer may include a first metal layer surrounding the transmission portion and a second metal layer separated from the first metal layer, the second metal layer at least partially surrounding the first metal layer.

The metal layer may include a protrusion extending towards the transmission portion.

The display apparatus may further include: a lower electrode layer in the sensor area, wherein the lower electrode layer may be between the substrate and an auxiliary thin film transistor in the auxiliary pixel.

The metal layer may include a same material as the lower electrode layer.

The display apparatus may further include: an inorganic insulating layer on the substrate, wherein the inorganic insulating layer may have a first hole corresponding to the transmission portion, and the metal layer may have a width that is greater than a width of the first hole.

The display apparatus may further include: a component on a lower surface of the substrate, the component corresponding to the sensor area.

The substrate may further include an opening area surrounded by the display area, and an additional metal layer surrounding the opening area.

The substrate may have a substrate hole corresponding to the opening area.

According to one or more aspects, a method of manufacturing a display apparatus including a substrate having a display area and a sensor area, the display area including main pixels and the sensor area including auxiliary pixels and a transmission portion is provided. The method includes: forming a preliminary metal layer on an upper surface of the substrate, the preliminary metal layer overlapping the transmission portion; forming an opposite electrode on the preliminary metal layer; irradiating a laser beam to the preliminary metal layer from a lower surface of the substrate; and lifting off the preliminary metal layer, irradiated by the laser beam, from the substrate, wherein the preliminary metal layer has a pattern at an edge thereof.

The preliminary metal layer may include a center portion and an edge portion separated from the center portion, the edge portion surrounding the center portion.

The center portion may be at least partially connected to the edge portion.

The edge portion may include a first edge portion and a second edge portion, the first edge portion being separated from the second edge portion.

The first edge portion may be at least partially connected to the center portion.

The laser beam may include an infrared ray.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
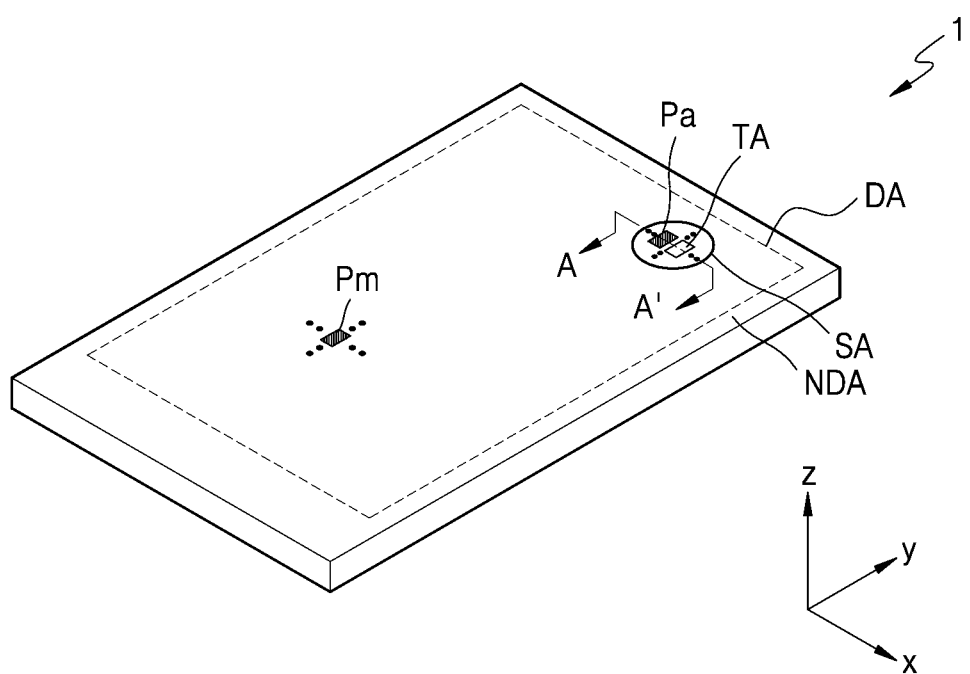
FIG. 1 is a perspective view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention."

As the present disclosure allows for various suitable changes and numerous embodiments, particular embodiments will be illustrated in the drawings and described in detail in the written description. The attached drawings for illustrating one or more embodiments are referred to in order to gain a sufficient understanding, the merits thereof, and the objectives accomplished by the implementation. However, the embodiments may have different forms and should not be construed as being limited to the descriptions set forth herein.

The example embodiments will be described below in more detail with reference to the accompanying drawings. Those components that are the same or are in correspondence are rendered the same reference numeral regardless of the figure number, and redundant explanations are omitted.

While such terms as "first," "second," etc., may be used to describe various components, such components are not be limited to the above terms. The above terms are used only to distinguish one component from another.

An expression used in the singular encompasses the expression of the plural, unless it has a clearly different meaning in the context.

In the present specification, it is to be understood that the terms "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "formed on" another layer, region, or component, it may be directly or indirectly formed on the other layer, region, or component. That is, for example, intervening layers, regions, or components may be present.

Sizes of components in the drawings may be exaggerated for convenience of explanation. In other words, because sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the embodiments below, when layers, areas, or elements or the like are referred to as being "connected," it will be understood that they may be directly connected or an intervening portion may be present between layers, areas or elements. For example, when layers, areas, or elements or the like are referred to as being "electrically connected," they may be directly electrically connected, or layers, areas or elements may be indirectly electrically connected and an intervening portion may be present.

Spatially relative terms, such as "lower", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. In addition, it will also be understood that when a layer is referred to as being "between" two layers, it can be the only layer between the two layers, or one or more intervening layers may also be present.

As used herein, the term "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view of a display apparatus 1 according to an embodiment.

Referring to FIG. 1, the display apparatus 1 includes a display area DA wherein images are displayed and a non-display area NDA wherein no images are displayed. The display apparatus 1 may provide a main image via light emitted from a plurality of main pixels Pm arranged in the display area DA.

The display apparatus 1 may include a sensor area SA. The sensor area SA may be an area where a component such as a sensor using an infrared ray, a visible ray, or sound is arranged thereunder. The sensor area SA may include a transmission portion TA, through which light and/or sound output from the component to outside or proceeding from outside to the component may transmit. In one or more embodiments, when the infrared ray transmits through the sensor area SA, an infrared ray transmittance of the entire sensor area SA may be about 10% or greater, about 20% or greater, about 25% or greater, about 50% or greater, about 85% or greater, or about 90% or greater.

In one or more embodiments, a plurality of auxiliary pixels Pa may be arranged in the sensor area SA, and an image (e.g., a set image or a predetermined image) may be provided using the light emitted from the plurality of auxiliary pixels Pa. The image provided by the sensor area SA is an auxiliary image having a resolution that is less than that of an image provided by the display area DA. That is, the sensor area SA includes the transmission portion TA, through which the light and/or sound may transmit, and thus, the number of auxiliary pixels Pa per unit area may be less than that of the main pixels Pm per unit area in the display area DA.

The sensor area SA may be at least partially surrounded by the display area DA, and in one or more embodiments, the sensor area SA is entirely surrounded by the display area DA as shown in FIG. 1.

Hereinafter, according to an embodiment, it is considered that the display apparatus 1 is an organic light-emitting display apparatus, but the display apparatus 1 of the disclosure is not limited thereto. In one or more embodiments, the display apparatus 1 may be an inorganic light-emitting display, a quantum dot light-emitting display, etc.

Referring to FIG. 1, the sensor area SA is in a portion (upper right portion) of the display area DA of a rectangular shape, but is not limited thereto. The display area DA may have a circular shape, an ellipse shape, or a polygonal shape such as a triangle, a pentagon, etc., and the location and/or the number of the sensor area SA may be modified in various suitable ways.

Figure 2:
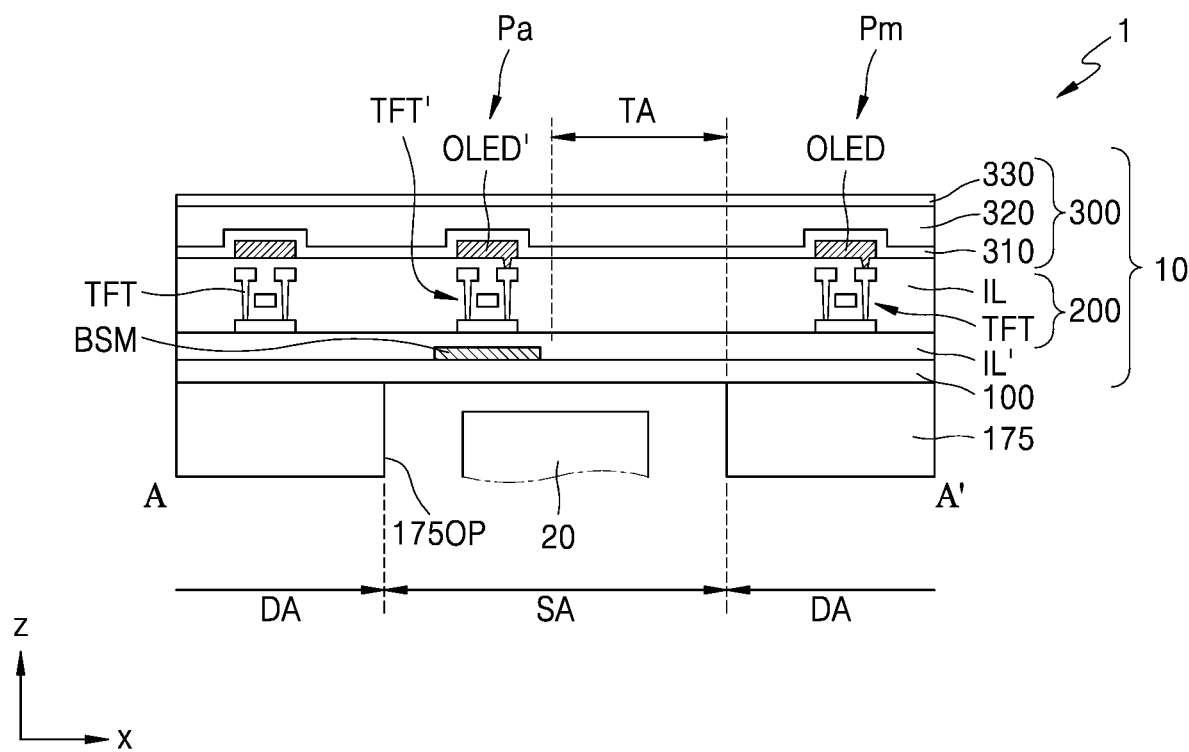
FIG. 2 is a cross-sectional view of a display apparatus taken along the line A-A' of FIG. 1.

FIG. 2 is a cross-sectional view of the display apparatus 1 according to one or more embodiments, taken along the line A-A' of FIG. 1.

Referring to FIG. 2, the display apparatus 1 may include a display panel 10 including display elements, and a component 20 corresponding to the sensor area SA.

The display panel 10 may include a substrate 100, a display element layer 200 on the substrate 100, and a thin film encapsulation layer 300 that is an encapsulation member for sealing the display element layer 200. In addition, the display panel 10 may further include a lower protective film 175 arranged under the substrate 100.

The substrate 100 may include glass or a polymer resin. The substrate 100 including the polymer resin may be flexible, rollable, or bendable. The substrate 100 may have a multi-layered structure including a layer including the polymer resin and/or an inorganic layer.

The display element layer 200 may include a circuit layer including main and auxiliary thin film transistors TFT and TFT', an organic light-emitting diode OLED that is a display element, and insulating layers IL and IL' between the thin film transistors TFT and TFT' and the organic light-emitting diode OLED.

The main pixels Pm each including a main thin film transistor TFT and a main organic light-emitting diode OLED connected to the main thin film transistor TFT are arranged in the display area DA, and the auxiliary pixels Pa each including an auxiliary thin film transistor TFT' and an auxiliary organic light-emitting diode OLED' connected to the auxiliary thin film transistor TFT' and wirings may be arranged in the sensor area SA.

In addition, the transmission portion TA, in which the auxiliary thin film transistor TFT' and display elements are not arranged (e.g., not present), may be located in the sensor area SA. The transmission portion TA may be understood as an area through which light/signals emitted from the component 20 or light/signals incident to the component 20 may be transmitted.

The component 20 may be located in the sensor area SA. The component 20 may be an electronic element using light or sound. For example, the component 20 may be a sensor for receiving light (e.g., an infrared ray sensor), a sensor outputting and sensing light or sound to measure a distance or to sense fingerprints, etc., a small-sized lamp for emitting light, or a speaker for outputting sound. The electronic element using light may use light in various suitable wavelength bands such as visible light, IR, ultraviolet (UV) ray, etc. A plurality of components 20 may be arranged in the sensor area SA. For example, a light-emitting device and a light-receiving device may be provided in one sensor area SA as the components 20. Alternatively, one component 20 may include a light-emitting portion and a light-receiving portion.

A lower electrode layer BSM may be arranged in the sensor area SA, and the lower electrode layer BSM may correspond to the auxiliary pixels Pa. That is, the lower electrode layer BSM may be arranged to correspond to a lower portion of the auxiliary thin film transistor TFT'. The lower electrode layer BSM may prevent or partially obstruct external light from reaching the auxiliary pixel Pa including the auxiliary thin film transistor TFT', etc. For example, the lower electrode layer BSM may prevent or partially obstruct the light emitted from the component 20 from reaching the auxiliary pixel Pa. In addition, a constant voltage or a signal is applied to the lower electrode layer BSM to prevent or reduce damage to a pixel circuit caused by an electrostatic discharge.

The thin film encapsulation layer 300 may include at least one inorganic encapsulation layer and at least one organic encapsulation layer. In this regard, referring to FIG. 2, the thin film encapsulation layer 300 may include first and second inorganic encapsulation layers 310 and 330, respectively, and an organic encapsulation layer 320 between the first and second inorganic encapsulation layers 310 and 330.

The first and second inorganic encapsulation layers 310 and 330 may include one or more inorganic insulating materials from among aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include an acryl-based resin, an epoxy-based resin, polyimide, polyethylene, etc.

The lower protective film 175 is attached to a lower portion of the substrate 100 to protect and support the substrate 100. The lower protective film 175 may have an opening 1750P corresponding to the sensor area SA. Because the lower protective film 175 has the opening 1750P, a light transmittance of the sensor area SA may be improved. The lower protective film 175 may include polyethylene terephthalate (PET) or polyimide (PI).

An area of the sensor area SA may be greater than that of a region where the component 20 is arranged. Accordingly, an area of the opening 1750P in the lower protective film 175 may not be equal to that of the sensor area SA. For example, the area of the opening 1750P may be less than that of the sensor area SA.

In one or more embodiments, components such as an input sensing member for sensing a touch input, an anti-reflection member including a polarizer and a retarder, or a color filter and a black matrix, a transparent window, etc. may be further arranged on the display panel 10.

In addition, in one or more embodiments, the thin film encapsulation layer 300 is used as an encapsulation member for sealing the display element layer 200, but one or more embodiments are not limited thereto. For example, an encapsulation substrate that is bonded to the substrate 100 via a sealant or a frit may be used as the member for encapsulating the display element layer 200.

Figure 3:
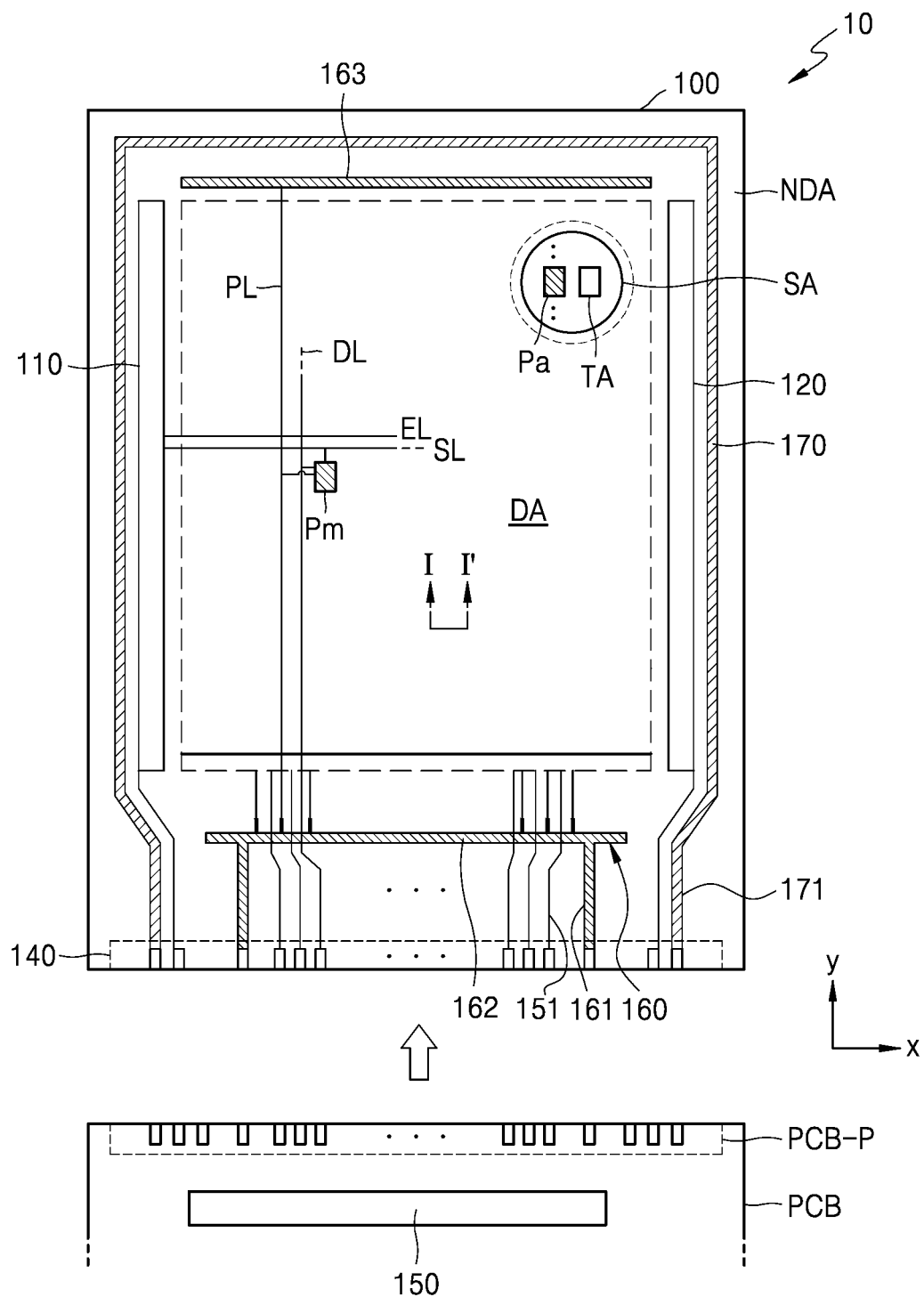
FIG. 3 is a plan view of a display apparatus according to an embodiment.

FIG. 3 is a plan view of the display panel 10 according to an embodiment.

Referring to FIG. 3, the display panel 10 is arranged in the display area DA and includes the plurality of main pixels Pm. Each of the main pixels Pm may include a display element such as an organic light-emitting diode. Each of the main pixels Pm may emit light (e.g., red light, green light, blue light, or white light, via the organic light-emitting diode). In one or more embodiments, the main pixel Pm may be understood as a pixel for emitting red light, green light, blue light, or white light, as described above. The display area DA is covered by the encapsulation member described above with reference to FIG. 2, so as to be protected against external air or moisture.

The sensor area SA may be arranged in the display area DA and the plurality of auxiliary pixels Pa may be arranged in the sensor area SA. Each of the auxiliary pixels Pa may include a display element such as an organic light-emitting diode. Each of the auxiliary pixels Pa may emit light (e.g., red light, green light, blue light, or white light), via the organic light-emitting diode. In one or more embodiments, the auxiliary pixel Pa may be understood as a pixel emitting red light, green light, blue light, or white light, as described above. In addition, the sensor area SA includes the transmission portion TA between the auxiliary pixels Pa.

In one or more embodiments, one main pixel Pm and one auxiliary pixel Pa may include same pixel circuits (i.e., use the same pixel circuits). However, one or more embodiments are not limited thereto. That is, the pixel circuit included in the main pixel Pm and the pixel circuit included in the auxiliary pixel Pa may be different from each other.

The sensor area SA includes the transmission portion TA, and thus a resolution of the sensor area SA may be less than that of the display area DA. For example, the resolution of the sensor area SA may be half the resolution of the display area DA. In one or more embodiments, the resolution of the display area DA may be 400 ppi or greater, and the resolution of the sensor area SA may be about 200 ppi or greater.

Each of the main and auxiliary pixels Pm and Pa may be electrically connected to external pixels arranged in the non-display area NDA. In the non-display area NDA, a first scan driving circuit 110, a second scan driving circuit 120, a terminal 140, a data driving circuit 150, a first power supply line 160, and a second power supply line 170 may be arranged.

The first scan driving circuit 110 may provide each pixel Pm or Pa with a scan signal via a scan line SL. The first scan driving circuit 110 may provide each pixel Pm or Pa with an emission control signal via an emission control line EL. The second scan driving circuit 120 may be arranged in parallel with the first scan driving circuit 110 with the display area DA arranged between the first scan driving circuit 110 and the second scan driving circuit 120. Some of the pixels Pm and Pa arranged in the display area DA may be electrically connected to the first scan driving circuit 110, and the other pixels may be electrically connected to the second scan driving circuit 120. In one or more embodiments, the second scan driving circuit 120 may be omitted.

The terminal 140 may be arranged at a side of the substrate 100. The terminal 140 may not be covered by an insulating layer (i.e., the terminal 140 may be exposed), and may be electrically connected to a printed circuit board PCB. A terminal PCB-P of the printed circuit board PCB may be electrically connected to the terminal 140 of the display panel 10. The printed circuit board PCB may transfer a signal or a power of a controller to the display panel 10. A control signal generated by the controller may be respectively transferred to the first and second scan driving circuits 110 and 120 via the printed circuit board PCB. The controller may provide the first and second power supply lines 160 and 170 respectively with a first power voltage ELVDD and a second power voltage and ELVSS via first and second connecting lines 161 and 171. The first power voltage ELVDD is supplied to each pixel Pm or Pa via a driving voltage line PL connected to the first power supply line 160, and the second power voltage ELVSS may be provided to an opposite electrode of each pixel Pm or Pa connected to the second power supply line 170.

The data driving circuit 150 is electrically connected to a data line DL. A data signal of the data driving circuit 150 may be provided to each of the pixels Pm and Pa via a connecting line 151 connected to the terminal 140 and the data line DL connected to the connecting line 151. Although the embodiment in FIG. 3 shows that the data driving circuit 150 is arranged on the printed circuit board PCB, in one or more embodiments, the data driving circuit 150 is arranged on the substrate 100. For example, the data driving circuit 150 may be arranged between the terminal 140 and the first power supply line 160.

The first power supply line 160 may include a first sub-line 162 and a second sub-line 163 that extend in parallel with each other along an X-direction with the display area DA interposed therebetween. The second power supply line 170 has a loop shape having an opening side to partially surround the display area DA.

Figure 4:
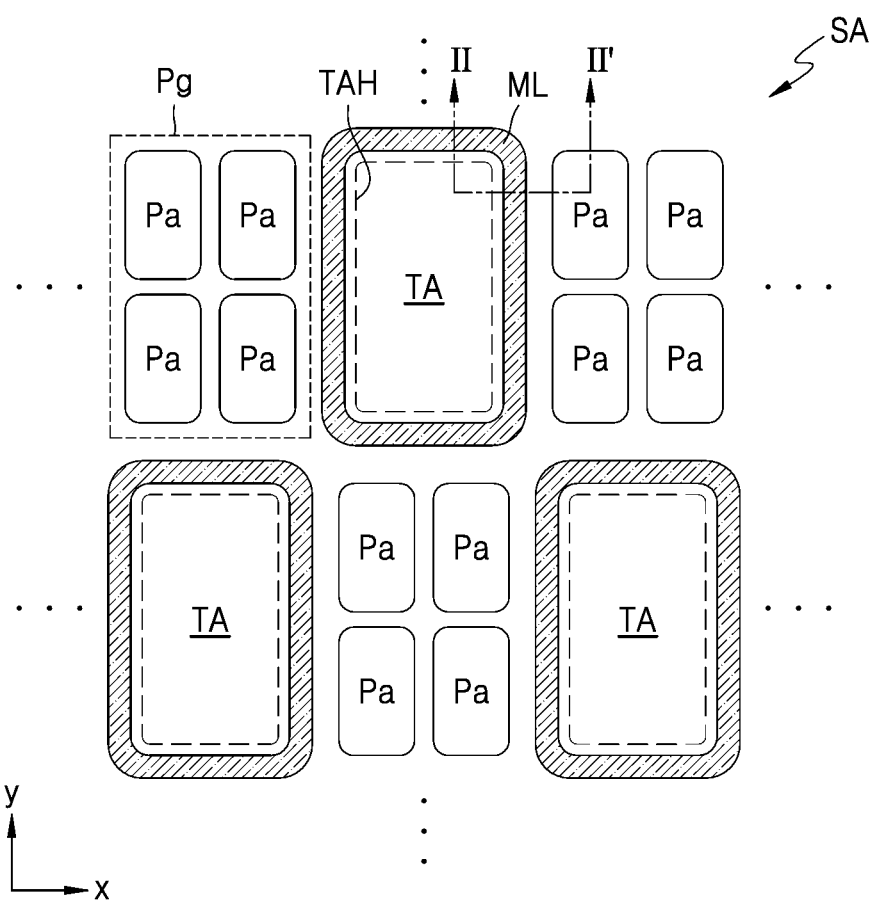
FIG. 4 is a plan view showing a part of a sensor area of FIG. 3.
Figure 5A:
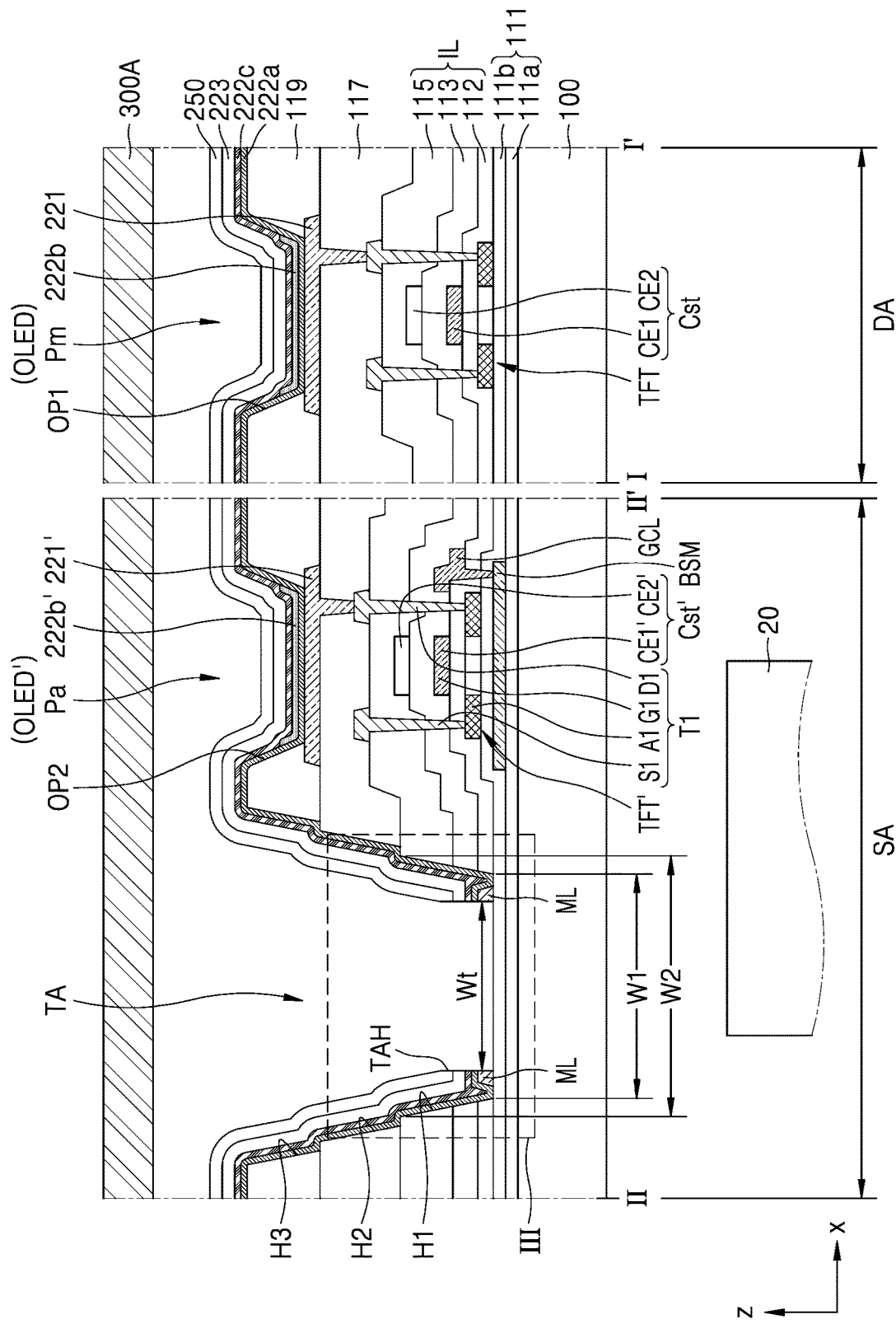
FIG. 5A is a cross-sectional view of the display apparatus taken along the line I-I' of FIG. 3 and line II-II' of FIG. 4.
Figure 5B:
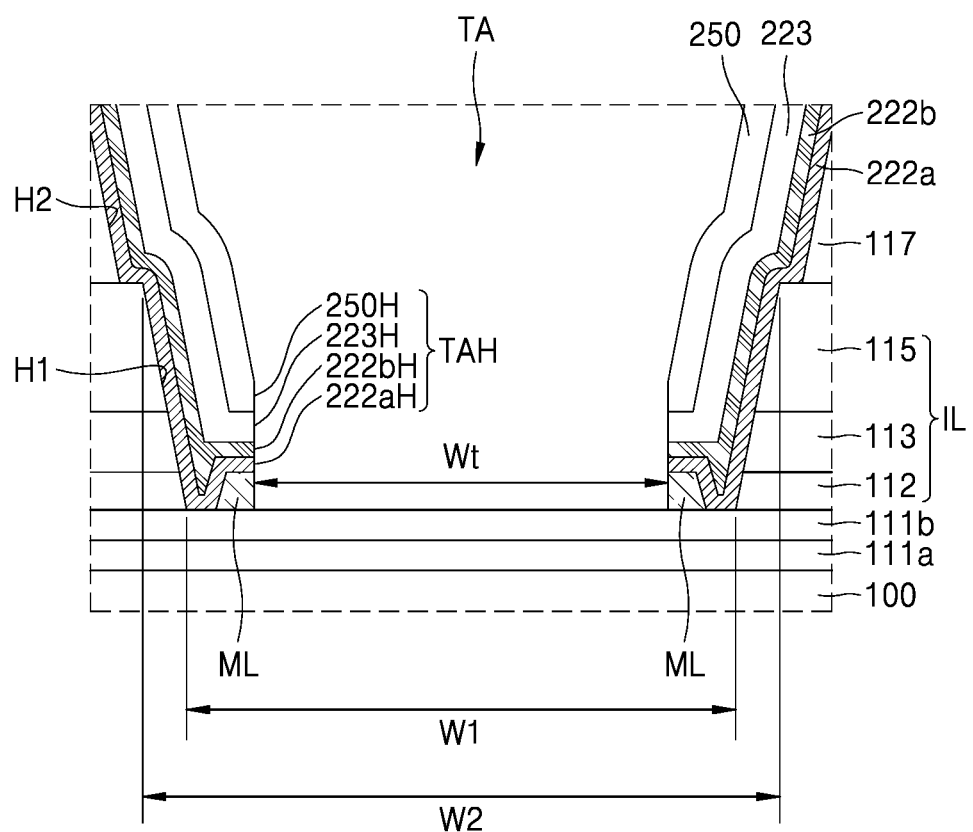
FIG. 5B is an enlarged view of a portion III of FIG. 5A.

FIG. 4 is a plan view partially showing the sensor area SA of FIG. 3, and FIG. 5A is a cross-sectional view of the display apparatus taken along the line I-I' of FIG. 3 and the line II-II' of FIG. 4. FIG. 5B is an enlarged view of a portion III of FIG. 5A.

Referring to FIG. 4, the auxiliary pixels Pa and the transmission areas (i.e., transmission portions) TA are arranged in the sensor area SA of the display apparatus according to an embodiment. A set (e.g., predetermined) number of auxiliary pixels Pa may be continuously arranged to form one pixel group Pg. The pixel group Pg may include at least one auxiliary pixel Pa. In FIG. 4, one pixel group Pg includes four auxiliary pixels Pa arranged in two columns (e.g., two auxiliary pixels Pa per column). However, one or more embodiments are not limited thereto. The number of the auxiliary pixels Pa and the arrangement of the auxiliary pixels Pa in one pixel group Pg may be modified in various suitable ways. For example, one pixel group Pg may include three auxiliary pixels Pa arranged in a row.

The transmission portion TA has a high light transmittance because a display element is not arranged in the transmission portion TA, and a plurality of transmission areas TA may be included in the sensor area SA. The transmission areas TA may be arranged alternately with the pixel groups Pg along a first direction (X-direction) and/or a second direction (Y-direction). Alternatively, the transmission areas TA may be arranged to surround the pixel group Pg. Alternatively, the auxiliary pixels Pa may be arranged to surround the transmission portion TA.

In one or more embodiments, a metal layer ML is arranged around the transmission portion TA so as to at least partially surround the transmission portion TA. The metal layer ML may be understood to be arranged between the transmission portion TA and the pixel group Pg. In FIG. 4, the metal layer ML is continuously provided to surround one transmission portion TA, but is not limited thereto. That is, the metal layer ML may be modified in various suitable ways, for example, the metal layer ML may be partially disconnected. Various suitable shapes of the metal layer ML will be described later with reference to FIGS. 8A-8D.

Referring to FIG. 5A, the display apparatus according to an embodiment includes the display area DA and the sensor area SA. The main pixels Pm are arranged in the display area DA, and the auxiliary pixels Pa and the transmission portion TA are arranged in the sensor area SA.

Each of the main pixels Pm may include the main thin film transistor TFT, a main storage capacitor Cst, and the main organic light-emitting diode OLED. Each of the auxiliary pixels Pa may include the auxiliary thin film transistor TFT', an auxiliary storage capacitor Cst', and the auxiliary organic light-emitting diode OLED'. The transmission portion TA may include a transmission hole TAH corresponding to the transmission portion TA. The metal layer ML is arranged around the transmission hole TAH.

The component 20 may be arranged under the sensor area SA. The component 20 may be an infrared ray (IR) sensor for transmitting/receiving the infrared ray. Because the transmission portion TA is arranged in the sensor area SA, IR signals transmitted to/received from the component 20 may transmit through the sensor area SA. For example, the light emitted from the component 20 may proceed along a Z-direction through the transmission portion TA, and light generated on the outside of the display apparatus and incident to the component 20 may proceed along a Z-direction through the transmission portion TA.

Hereinafter, a structure in which elements included in the display apparatus according to the embodiment are laminated will be described below.

The substrate 100 may include glass or a polymer resin. The polymer resin may include a polyethersulfone (PES), polyacrylate, polyetherimide (PEI), polyethylene naphthalate (PEN), polyethylene terephthalate (PET), polyphynylene sulfide (PPS), polyarylate, polyimide (PI), polycarbonate (PC), cellulose acetate propionate (CAP), etc. The substrate 100 including the polymer resin may be flexible, rollable, or bendable. The substrate 100 may have a multi-layered structure including a layer including the polymer resin and an inorganic layer.

A buffer layer 111 is located on the substrate 100 to reduce or block infiltration of impurities, moisture, or external air from a lower portion of the substrate 100, and to provide a flat surface on the substrate 100. The buffer layer 111 may include an inorganic material such as an oxide material or a nitride material, an organic material, or an inorganic-organic composite material, and may have a single-layer or multi-layered structure including the inorganic material and/or the organic material. A barrier layer for preventing or reducing infiltration of external air may be further provided between the substrate 100 and the buffer layer 111. In some embodiments, the buffer layer 111 may include silicon oxide (e.g., $SiO_2$) or silicon nitride (SiNx). The buffer layer 111 may include a first buffer layer 111a and a second buffer layer 111b laminated therein.

In the sensor area SA, a lower electrode layer BSM may be arranged between the first buffer layer 111a and the second buffer layer 111b. In one or more embodiments, the lower electrode BSM may be arranged between the substrate 100 and the first buffer layer 111a. The lower electrode layer BSM is arranged under the auxiliary thin film transistor TFT', and may prevent or reduce degradation of the auxiliary thin film transistor TFT' due to the light emitted from the component 20.

Also, the lower electrode layer BSM may be connected to a wiring GCL that is arranged at another layer via a contact hole. The lower electrode layer BSM may receive a supply of the constant voltage or the signal from the wiring GCL. For example, the lower electrode layer BSM may receive a first power voltage ELVDD or a scan signal. Because the lower electrode layer BSM is provided with the constant voltage or signal, a probability of generating an electrostatic discharge may be noticeably reduced. The lower electrode layer BSM may include aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and/or copper (Cu). The lower electrode layer BSM may have a single-layer or a multi-layered structure including one or more of the above-stated materials.

The main thin film transistor TFT and the auxiliary thin film transistor TFT' may be on the buffer layer 111. The main thin film transistor TFT includes a first semiconductor layer A1, a first gate electrode G1, a first source electrode S1, and a first drain electrode D1, and the auxiliary thin film transistor TFT' includes a second semiconductor layer A2, a second gate electrode G2, a second source electrode S2, and a second drain electrode D2. The main thin film transistor TFT is connected to the main organic light-emitting diode OLED of the display area DA to drive the main organic light-emitting diode OLED. The auxiliary thin film transistor TFT' is connected to the auxiliary organic light-emitting diode OLED' of the sensor area SA to drive the auxiliary thin film transistor OLED'.

The first semiconductor layer A1 and the second semiconductor layer A2 are on the buffer layer 111, and may include polysilicon. In one or more embodiments, the first semiconductor layer A1 and the second semiconductor layer A2 may include amorphous silicon. In one or more embodiments, the first semiconductor layer A1 and the second semiconductor layer A2 may each include an oxide of at least one selected from the group consisting of indium (In), gallium (Ga), stannum (Sn), zirconium (Zr), vanadium (V), hafnium (Hf), cadmium (Cd), germanium (Ge), chrome (Cr), titanium (Ti), and zinc (Zn). The first and second semiconductor layers A1 and A2 may each include a channel region, and a source region and a drain region doped with impurities.

The first semiconductor layer A1 may overlap the lower electrode BSM with the second buffer layer 111b therebetween. In one or more embodiments, a width of the first semiconductor layer A1 may be less than that of the lower electrode layer BSM, and thus, the first semiconductor layer A1 may entirely overlap the lower electrode layer BSM when it is projected from a direction perpendicular to (or normal to) the substrate 100.

A first gate insulating layer 112 may cover the first semiconductor layer A1 and the second semiconductor layer A2. The first gate insulating layer 112 may include an inorganic insulating material such as silicon oxide (e.g., $SiO_2$), silicon nitride (SiNx), silicon oxynitride (SiON), aluminum oxide ($Al_2O_3$), titanium oxide (e.g., $TiO_2$), tantalum oxide (e.g., $Ta_2O_5$), hafnium oxide (e.g., $HfO_2$), and/or zinc oxide (e.g., $ZnO_2$). The first gate insulating layer 112 may have a single-layer or a multi-layered structure including the inorganic insulating material.

The first gate electrode G1 and the second gate electrode G2 are arranged on the first gate insulating layer 112 so as to respectively overlap the first semiconductor layer A1 and the second semiconductor layer A2. The first gate electrode G1 and the second gate electrode G2 may include one or more of Mo, Al, Cu, Ti, etc., and may each have a single-layer or a multi-layered structure. For example, the first gate electrode G1 and the second gate electrode G2 may each have a single-layer structure including Mo.

A second gate insulating layer 113 may cover the first gate electrode G1 and the second gate electrode G2. The second gate insulating layer 113 may include an in organic insulating material such as silicon oxide (e.g., $SiO_2$), silicon nitride (SiNx), silicon oxynitride (SiON), aluminum oxide (e.g., $Al_2O_3$), titanium oxide (e.g., $TiO_2$), tantalum oxide (e.g., $Ta_2O_5$), hafnium oxide (e.g., $HfO_2$), and/or zinc oxide (e.g., $ZnO_2$). The second gate insulating layer 113 may have a single-layer or a multi-layered structure including the inorganic insulating material.

A first upper electrode CE2 of the main storage capacitor Cst and a second upper electrode CE2' of the auxiliary storage capacitor Cst' may be arranged on the second gate insulating layer 113.

In the display area DA, the first upper electrode CE2 may overlap the first gate electrode G1 arranged thereunder. The first gate electrode G1 and the first upper electrode CE2 overlapping each other with the second gate insulating layer 113 therebetween may configure the main storage capacitor Cst. The first gate electrode G1 may be a first lower electrode CE1 of the main storage capacitor Cst.

In the sensor area SA, the second upper electrode CE2' may overlap the second gate electrode G2 arranged thereunder. The second gate electrode G2 and the second upper electrode CE2' overlapping each other with the second gate insulating layer 113 therebetween may configure the auxiliary storage capacitor Cst'. The first gate electrode G1 may be a second lower electrode CE1' of the auxiliary storage capacitor Cst'.

The first upper electrode CE2 and the second upper electrode CE2' may each include Al, Pt, Pd, Ag, Mg, Au, Ni, Nd, Ir, Cr, Li, Ca, Mo, Ti, W, and/or Cu, and may have a single-layer or multi-layered structure.

An interlayer insulating layer 115 may cover the first upper electrode CE2 and the second upper electrode CE2'. The interlayer insulating layer 115 may include an insulating material such as silicon oxide (e.g., $SiO_2$), silicon nitride (SiNx), silicon oxynitride (SiON), aluminum oxide ($Al_2O_3$), titanium oxide (e.g., $TiO_2$), tantalum oxide (e.g., $Ta_2O_5$), hafnium oxide (e.g., $HfO_2$), and/or zinc oxide (e.g., $ZnO_2$).

When the first gate insulating layer 112, the second gate insulating layer 113, and the interlayer insulating layer 115 are collectively referred to as an inorganic insulating layer IL, the inorganic insulating layer IL may have a first hole H1 corresponding to the transmission portion TA. The first hole H1 may expose an upper surface of the buffer layer 111 or the substrate 100. The first hole H1 may include a first opening of the first gate insulating layer 112, a second opening of the second gate insulating layer 113, and a third opening of the interlayer insulating layer 115, wherein the first to third openings correspond to the transmission portion TA. The first to third openings may be separately formed through separate processes, or may be concurrently (e.g., simultaneously) formed through one process. Alternatively, the first opening and the second opening may be concurrently (e.g., simultaneously) formed, and the third opening may be separately formed. When the first to third openings are obtained through separate processes, a step may be generated on a side surface of the first hole H1.

Alternatively, in one or more embodiments, the inorganic insulating layer IL may include a groove instead of the first hole H1 exposing the buffer layer 111. For example, the first gate insulating layer 112 in the inorganic insulating layer IL is arranged continuously with respect to the transmission portion TA, and the second gate insulating layer 113 and the interlayer insulating layer 115 may respectively have the second opening and the third opening corresponding to the transmission portion TA.

Alternatively, the first gate insulating layer 112 and the second gate insulating layer 113 may be continuously arranged to correspond to the transmission portion TA, and the interlayer insulating layer 115 may have the third opening corresponding to the transmission portion TA.

In one or more embodiments, the inorganic insulating layer IL may not have the first hole H1 corresponding to the transmission portion TA. The inorganic insulating layer IL may have the transmittance of the light that may be transmitted from/received by the component 20, and may not have the hole corresponding to the transmission portion TA.

The first and second source electrodes S1 and S2 and the first and second drain electrodes D1 and D2 are arranged on the interlayer insulating layer 115. The source electrodes S1 and S2 and the drain electrodes D1 and D2 may each include one or more conductive materials including Mo, Al, Cu, Ti, etc., and may have a single-layer or multi-layered structure including one or more of the above materials. For example, the source electrodes S1 and S2 and the drain electrode D1 and D2 may each have a multi-layered structure including Ti/Al/Ti.

A planarization layer 117 may cover the source electrodes S1 and S2 and the drain electrodes D1 and D2. The planarization layer 117 may have a flat upper surface so that a first pixel electrode 221 and a second pixel electrode 221' arranged thereon may be planarized.

The planarization layer 117 may include a single-layer or multi-layered structure including an organic material or an inorganic material. The planarization layer 117 may include a general universal polymer (benzocyclobutene (BCB), polyimide, hexamethyldisiloxane (HMDSO), polymethylmethacrylate (PMMA), or polystyrene (PS)), polymer derivatives having phenol groups, acryl-based polymer, imide-based polymer, aryl ether-based polymer, amide-based polymer, fluoride-based polymer, p-xylene-based polymer, vinyl alcohol-based polymer, and blends (e.g., combinations) thereof. The planarization layer 117 may include an insulating material such as silicon oxide (e.g., $SiO_2$), silicon nitride (SiNx), silicon oxynitride (SiON), aluminum oxide ($Al_2O_3$), titanium oxide (e.g., $TiO_2$), tantalum oxide (e.g., $Ta_2O_5$), hafnium oxide (e.g., $HfO_2$), and/or zinc oxide (e.g., $ZnO_2$). After arranging the planarization layer 117, a chemical and mechanical polishing may be performed to provide a flat upper surface.

The planarization layer 117 may have a second hole H2 corresponding to the transmission portion TA. The second hole H2 may overlap the first hole H1. In one or more embodiments, a lower width W2 of the second hole H2 is greater than a lower width W1 of the first hole H1, but is not limited thereto. For example, the planarization layer 117 may cover an edge of the first hole H1 of the inorganic insulating layer IL, and thus, the width of the second hole H2 may be less than that of the first hole H1.

The planarization layer 117 has an opening that exposes one of the first source electrode S1 and the first drain electrode D1 of the main thin film transistor TFT, and the first pixel electrode 221 may contact the first source electrode S1 or the first drain electrode D1 via the opening to be electrically connected to the main thin film transistor TFT.

Also, the planarization layer 117 may have an opening that exposes one of the second source electrode S2 and the second drain electrode D2 of the auxiliary thin film transistor TFT', and the second pixel electrode 221' may contact the second source electrode S2 or the second drain electrode D2 via the opening to be electrically connected to the auxiliary thin film transistor TFT'.

The first pixel electrode 221 and the second pixel electrode 221' may each include conductive oxide such as indium tin oxide (ITO), indium zinc oxide (IZO), zinc oxide (ZnO), indium oxide ($In_2O_3$), indium gallium oxide, or aluminum zinc oxide (AZO). In one or more embodiments, the first pixel electrode 221 and the second pixel electrode 221' may each include a reflective layer including Ag, Mg, Al, Pt, Pd, Au, Ni, Nd, Ir, Cr, or a compound thereof. In one or more embodiments, the first pixel electrode 221 and the second pixel electrode 221' may further include a layer including ITO, IZO, ZnO, or $In_2O_3$ on/under the reflective layer. In some embodiments, the first pixel electrode 221 and the second pixel electrode 221' may have a laminated structure including ITO/Ag/ITO.

A pixel defining layer 119 may cover boundaries of each of the first pixel electrode 221 and the second pixel electrode 221'. The pixel defining layer 119 overlaps each of the first pixel electrode 221 and the second pixel electrode 221', and has a first opening OP1 and a second opening OP2 that define a light emission region of a pixel. The pixel defining layer 119 increases a distance between an edge of the first and second pixel electrodes 221 and 221' and an opposite electrode 223 on the pixel electrodes 221 and 221' to prevent or reduce generation of arc at the edge of the pixel electrodes 221 and 221'. The pixel defining layer 119 may include an organic insulating material such as polyimide, polyamide, an acrylic resin, BCB, HMDSO, and a phenol resin, and may be obtained by a spin coating, etc.

The pixel defining layer 119 may have a third hole H3 located in the transmission portion TA. The third hole H3 may overlap the first hole H1 and the second hole H2. Because the first to third holes H1 to H3 are provided, light transmittance of the transmission portion TA may be improved. The opposite electrode 223 that will be described later may be arranged on internal walls of the first to third holes H1 to H3.

The metal layer ML may be arranged in the first to third holes H1 to H3. The metal layer ML may be separated from the internal wall of the first hole H1.

The metal layer ML may be introduced in order to form the transmission hole TAH that will be described later. Alternatively, the metal layer ML may be provided to prevent or reduce thermal diffusion when the transmission hole TAH is formed. Functions of the metal layer ML will be described later.

The metal layer ML may include various suitable kinds of metal. In some embodiments, the metal layer ML may be concurrently (e.g., simultaneously) formed with the first and second pixel electrodes 221 and 221' by using the same material as that of the pixel electrodes 221 and 221'. In some embodiments, the metal layer ML may have a stack structure including ITO/Ag/ITO. However, one or more embodiments are not limited thereto. In one or more embodiments, the metal layer ML may be formed concurrently (e.g., simultaneously) with the gate electrodes G1 and G2, the source electrodes S1 and S2, and the drain electrodes D1 and D2 by using the same material.

A first functional layer 222a may cover the pixel defining layer 119. The first functional layer 222a may have a single-layer or multi-layered structure. The first functional layer 222a may be a hole transport layer (HTL) including a single-layer structure. Alternatively, the first functional layer 222a may include a hole injection layer (HIL) and the HTL. The first functional layer 222a may be integrally formed to correspond to the main pixels Pm and the auxiliary pixels Pa included in the display area DA and the sensor area SA, respectively.

A first emission layer 222b and a second emission layer 222b' are on the first functional layer 222a to correspond respectively to the first pixel electrode 221 and the second pixel electrode 221'. The first emission layer 222b and the second emission layer 222b' may respectively include a polymer material or a low-molecular material, and may emit red light, green light, blue light, or white light.

A second functional layer 222c may be formed on the first emission layer 222b and the second emission layer 222b'. The second functional layer 222c may have a single-layer or multi-layered structure. The second functional layer 222c may include an electron transport layer (ETL) and/or an electron injection layer (EIL). The second functional layer 222c may be integrally formed to correspond to the main pixels Pm and the auxiliary pixels Pa included in the display area DA and the sensor area SA. The first functional layer 222a and/or the second functional layer 222c may be omitted.

The opposite electrode 223 is arranged on the second functional layer 222c. The opposite electrode 223 may include a conductive material having a low work function. For example, the opposite electrode 223 may include a semi-transparent layer including Ag, Mg, Al, Pt, Pd, Au, Ni, Nd, Ir, Cr, lithium (Li), calcium (Ca), or an alloy thereof. Alternatively, the opposite electrode 223 may further include a layer including ITO, IZO, ZnO, or $In_2O_3$ on the (semi-)transparent layer including the above material. The opposite electrode 223 may be integrally formed to correspond to the main pixels Pm and the auxiliary pixels Pa included in the display area DA and the sensor area SA.

Layers from the first pixel electrode 221 to the opposite electrode 223 formed in the display area DA may configure the main organic light-emitting diode OLED. Layers from the second pixel electrode 221' to the opposite electrode 223 formed in the sensor area SA may configure the auxiliary organic light-emitting diode OLED'.

A capping layer 250 may be on the opposite electrode 223. The capping layer 250 may include LiF. Alternatively, the capping layer 250 may include an inorganic insulating material such as silicon nitride, and/or an organic insulating material. In one or more embodiments, the capping layer 250 may be omitted.

In one or more embodiments, the first functional layer 222a, the second functional layer 222c, the opposite electrode 223, and the capping layer 250 may each have the transmission hole TAH corresponding to the transmission portion TA. That is, the first functional layer 222a, the second functional layer 222c, the opposite electrode 223, and the capping layer 250 may respectively have openings 222aH, 222bH, 223H, and 250H corresponding to the transmission portion TA. In one or more embodiments, the openings 222aH, 222bH, 223H, and 250H forming the transmission hole TAH may have widths that are substantially the same as one another. For example, the opening 223H in the opposite electrode 223 may have a width that is substantially the same as that of the transmission hole TAH.

Also, in one or more embodiments, the first functional layer 222a, the second functional layer 222c, and the capping layer 250 may be omitted. In this case, the opening 223H of the opposite electrode 223 may be the transmission hole TAH.

That the transmission hole TAH corresponds to the transmission portion TA may be understood as that the transmission hole TAH overlaps the transmission portion TA. Here, an area of the transmission hole TAH may be less than that of the first hole H1 formed in the inorganic insulating layer IL. For example, in FIG. 5A, a width Wt of the transmission hole TAH is less than the width W1 of the first hole H1. Here, the area of the transmission hole TAH and the area of the first hole H1 may be each defined as an area of the narrowest opening.

In one or more embodiments, the first functional layer 222a, the second functional layer 222c, the opposite electrode 223, and the capping layer 250 may be arranged on side surfaces of the first hole H1, the second hole H2, and the third hole H3. In some embodiments, an inclination of the side surfaces of the first to third holes H1 to H3 with respect to the upper surface of the substrate 100 may be slower (e.g., less steep or more gradual) than that of the transmission hole TAH with respect to the upper surface of the substrate 100.

Formation of the transmission hole TAH removes members such as the opposite electrode 223 from the transmission portion TA, and thus, light transmittance of the transmission portion TA may be greatly improved.

The main organic light-emitting diode OLED and the auxiliary organic light-emitting diode OLED' may be covered by an encapsulation substrate 300A. The encapsulation substrate 300A may include a transparent material. For example, the encapsulation substrate 300A may include a glass material. Alternatively, the encapsulation substrate 300A may include a polymer resin, etc. The encapsulation substrate 300A may prevent or substantially prevent external moisture or impurities from infiltrating into the main organic light-emitting diode OLED and the auxiliary organic light-emitting diode OLED'.

A sealing material such as a sealant may be arranged between the substrate 100, on which the main organic light-emitting diode OLED and the auxiliary organic light-emitting diode OLED' are formed, and the encapsulation substrate 300A. The sealing material may block the external moisture or impurities that may be infiltrated between the substrate 100 and the encapsulation substrate 300A.

Figure 5C:
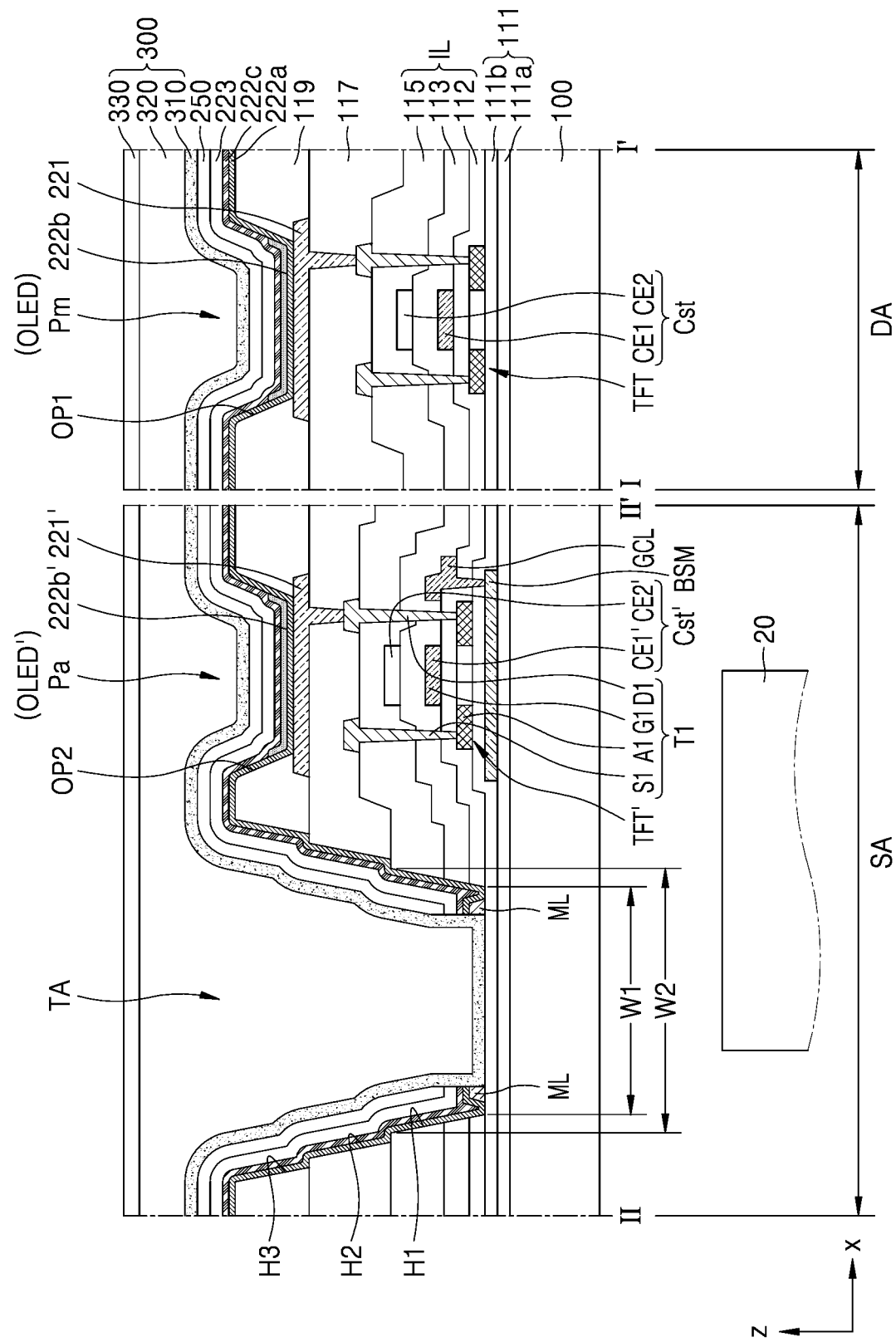
FIG. 5C is a cross-sectional view of a display apparatus according to an embodiment.

FIG. 5C is a cross-sectional view of a display apparatus according to an embodiment. In FIG. 5C, like reference numerals as those of FIG. 5A may denote like elements, and detailed descriptions thereof may be omitted.

Referring to FIG. 5C, the display apparatus according to the embodiment includes a thin film encapsulation layer 300 arranged on the capping layer 250. The thin film encapsulation layer 300 may include at least one inorganic encapsulation layer and at least one organic encapsulation layer, and regarding this, FIG. 5C shows a structure of the thin film encapsulation layer 300, in which a first inorganic encapsulation layer 310, an organic encapsulation layer 320, and a second inorganic encapsulation layer 330 are stacked. In one or more embodiments, a stacking order and the number of organic and inorganic encapsulation layers may vary.

The first and second inorganic encapsulation layers 310 and 330 may include one or more inorganic insulating materials such as aluminum oxide, titanium oxide, tantalum oxide, hafnium oxide, zinc oxide, silicon oxide, silicon nitride, and silicon oxynitride, and may be manufactured by chemical vapor deposition (CVD). The organic encapsulation layer 320 may include a polymer-based material. The polymer-based material may include a silicon-based resin, an acryl-based resin, an epoxy-based resin, polyimide, polyethylene, etc.

The first inorganic encapsulation layer 310, the organic encapsulation layer 320, and the second inorganic encapsulation layer 330 may be integrally formed to cover the display area DA and the sensor area SA. Accordingly, the first inorganic encapsulation layer 310, the organic encapsulation layer 320, and the second inorganic encapsulation layer 330 may be arranged in the transmission hole TAH.

In one or more embodiments, the organic encapsulation layer 320 may be integrally formed to cover the display area DA and the sensor area SA, but may not exist in the transmission portion TA (e.g., does not cover the transmission portion TA). In other words, the organic encapsulation layer 320 may have an opening corresponding to the transmission portion TA. In this case, the first inorganic encapsulation layer 310 and the second inorganic encapsulation layer 330 may contact each other in the transmission hole TAH.

Figure 6A:
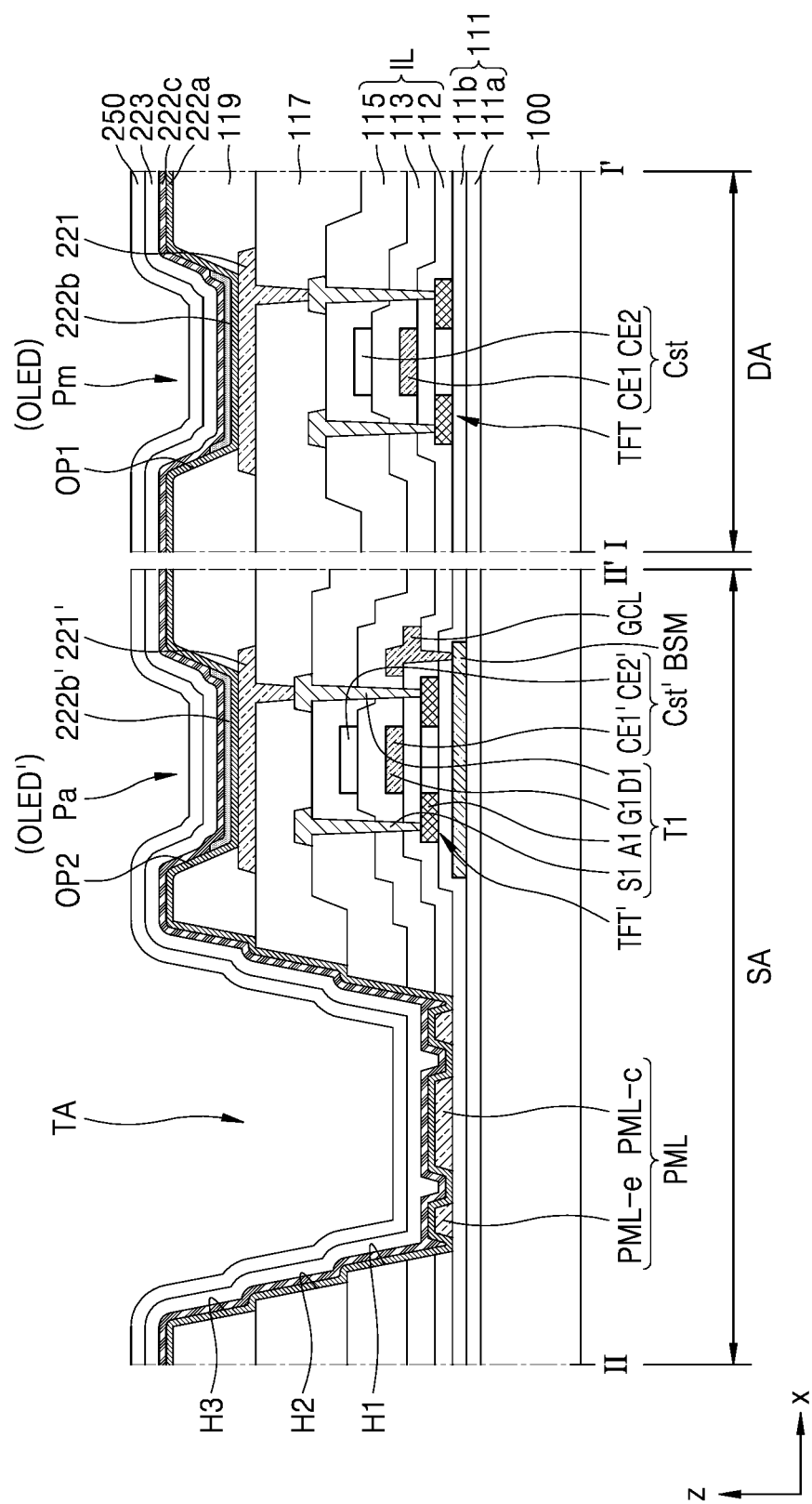
FIGS. 6A-6C are cross-sectional views illustrating a method of manufacturing a display apparatus according to an embodiment.
Figure 6B:
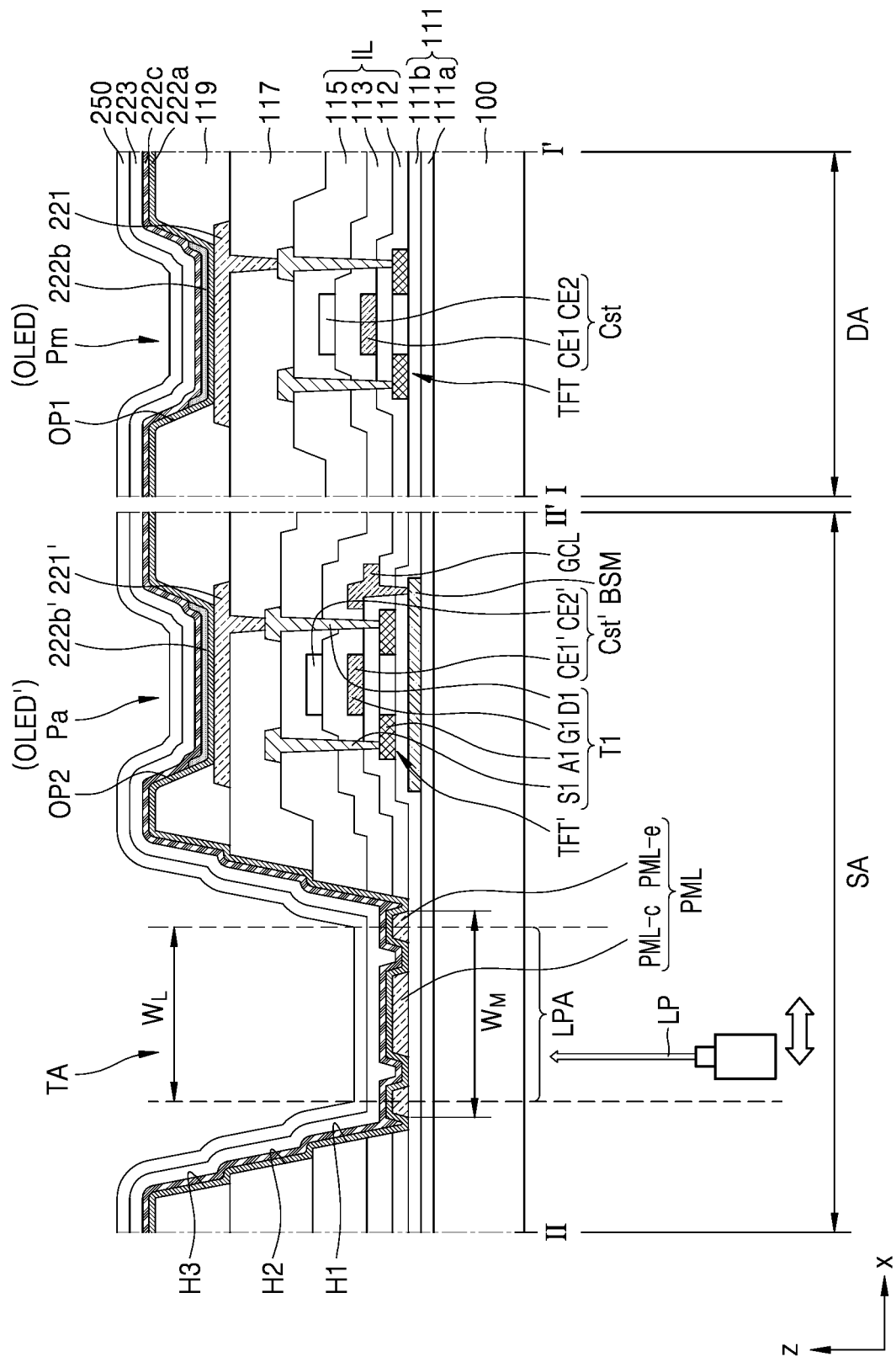
Figure 6C:
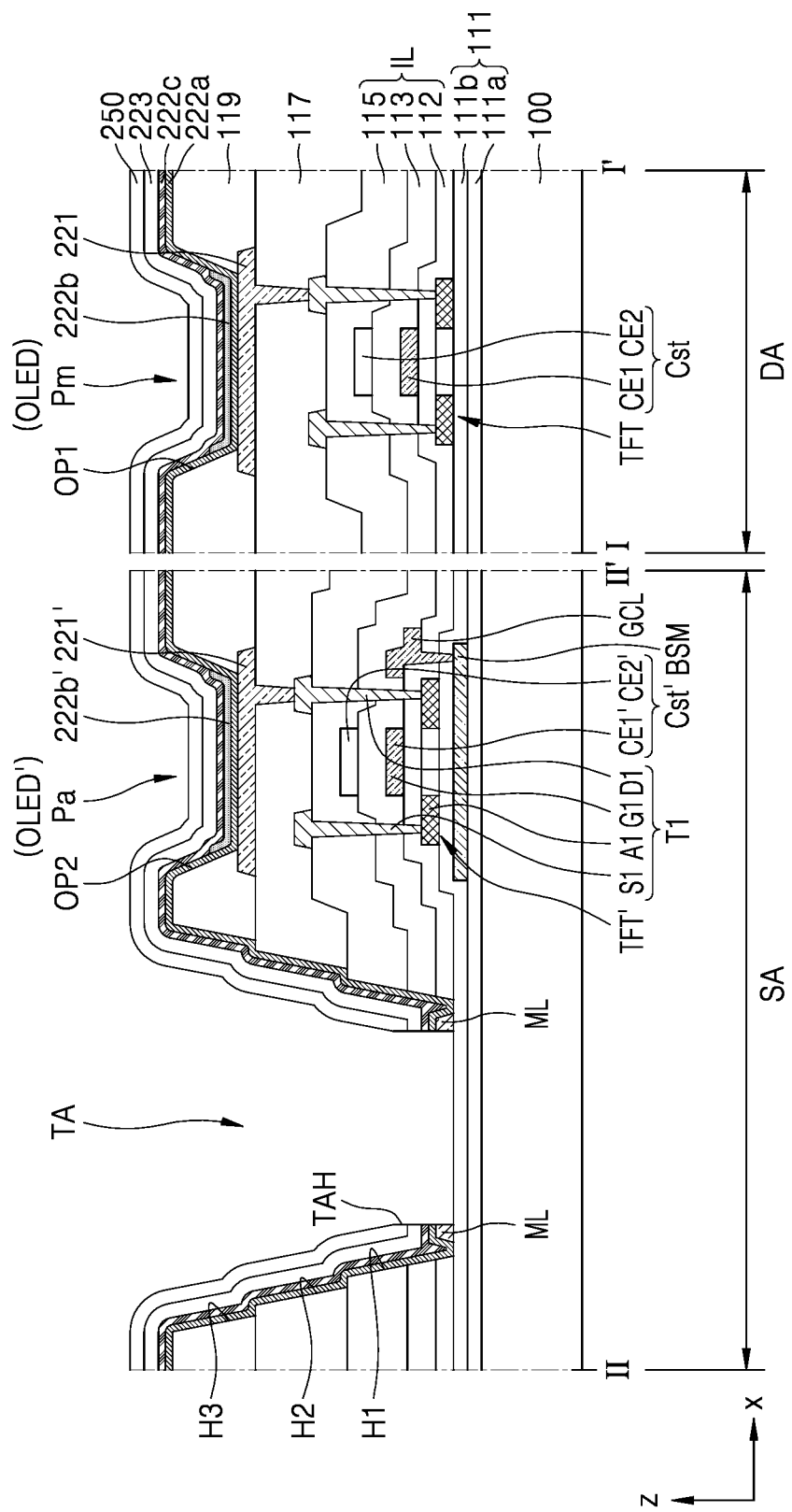

FIGS. 6A-6C are cross-sectional views sequentially illustrating a method of manufacturing the display apparatus according to an embodiment.

Referring to FIG. 6A, a preliminary metal layer PML is formed in the first hole H1 of the inorganic insulating layer IL. The preliminary metal layer PML may include a center portion PML-c and an edge portion PML-e. The center portion PML-c and the edge portion PML-e may be separate from each other. In one or more embodiments, the center portion PML-c and the edge portion PML-e may be at least partially connected to each other. The center portion PML-c may correspond to most of the transmission portion TA. The edge portion PML-e may denote an edge portion of the preliminary metal layer PML that is arranged to surround the center portion PML-c.

The preliminary metal layer PML may include one or more metals such as Ag, Al, PT, Pd, Au, Ni, Mo, Ti, etc. Also, the preliminary metal layer PML may further include a layer including ITO, IZO, ZnO, or $In_2O_3$ on/under the metal material. In one embodiment, the preliminary metal layer PML may be concurrently (e.g., simultaneously) formed with the pixel electrodes 221 and 221' by using the same material as that of the pixel electrodes 221 and 221'.

The first functional layer 222a, the second functional layer 222c, the opposite electrode 223, and the capping layer 250 that are integrally formed in the display area DA and the sensor area SA are sequentially formed on the preliminary metal layer PML.

Next, referring to FIG. 6B, a laser beam LP is directed to irradiate the preliminary metal layer PML arranged in the transmission portion TA from a lower portion of the substrate 100. That is, the laser beam LP proceeds in the Z-direction from the lower surface of the substrate 100 and then may be directed to irradiate to a lower surface of the preliminary metal layer PML. The laser beam LP may have a wavelength of the infrared ray (IR). When the laser beam LP is the IR, the transmittance through the substrate 100 and the buffer layer 111 is about 80% to about 90% or greater, and thus, the laser beam LP may efficiently reach the preliminary metal layer PML.

Because the preliminary metal layer PML includes opaque metal, the preliminary metal layer PML may absorb the laser beam LP. Accordingly, the preliminary metal layer PML thermally expands, and the preliminary metal layer PML, irradiated by the laser beam LP, may be lifted off from the substrate 100 or the buffer layer 111.

Because the preliminary metal layer PML is partially lifted off, the first functional layer 222a, the second functional layer 222c, the opposite electrode 223, and the capping layer 250 arranged on the preliminary metal layer PML may be also removed with the preliminary metal layer PML. Accordingly, as shown in FIG. 6C, the center portion PML-c of the preliminary metal layer PML is removed and the metal layer ML partially including the edge portion PML-e may be obtained. Also, the transmission hole TAH including the openings of the first functional layer 222a, the second functional layer 222c, the opposite electrode 223, and the capping layer 250 may be obtained.

When an inorganic material layer, an organic material layer, an opposite electrode, etc. arranged in the transmission portion TA are removed by directing the laser beam LP in the Z-direction, that is, from an upper portion of the substrate 100 towards the transmission portion TA, in order to form the transmission hole TAH, a laser processing surface may be secondarily damaged due to particles that are generated during the removing process. However, because the lifting-off caused by the thermal expansion of the preliminary metal layer PML is used in the embodiment, damage caused by the particles may not occur.

In some embodiments, the laser beam LP may be directed to irradiate the center portion PML-c, and not the entire portion of the preliminary metal layer PML. That is, an area of a region LPA irradiated by the laser beam LP may be smaller or less than that of the preliminary metal layer PML. To do this, in FIG. 6B, a width WL of the region LPA irradiated by the laser beam LP is less than a width WM of the preliminary metal layer PML.

When the laser beam LP is first directed to irradiate an outermost edge of the preliminary metal layer PML, heat may be diffused to the auxiliary pixels Pa adjacent to the transmission portion TA, and accordingly, damage to the auxiliary pixels Pa may occur. In the embodiment, because the area irradiated by the laser beam LP is less than that of the preliminary metal layer PML, diffusion of the heat caused by the laser beam LP may be prevented or reduced.

In addition, in order to prevent or reduce the thermal diffusion, the center portion PML-c and the edge portion PML-e of the preliminary metal layer PML may be separated from each other. Alternatively, a set (e.g., predetermined) pattern may be formed on or at the boundary of the preliminary metal layer PML.

FIGS. 7A-7E show shapes of the preliminary metal layer PML that may be applied to one or more embodiments, and FIGS. 8A-8E show shapes of the metal layers ML when the preliminary metal layers PML of FIGS. 7A-7E are used.

Figure 7A:
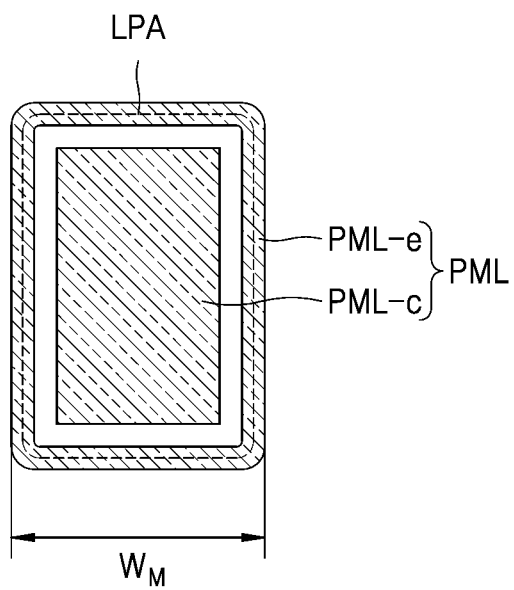
FIGS. 7A-7E are plan views of shapes of preliminary metal layers applied to one or more embodiments.

Referring to FIG. 7A, the preliminary metal layer PML includes the center portion PML-c and the edge portion PML-e surrounding the center portion PML-c. The center portion PML-c corresponds to a center of the transmission portion TA, and the edge portion PML-e is separated from the center portion PML-c and surrounds the center portion PML-c. The center portion PML-c may be arranged in the region LPA irradiated by the laser beam, and the edge portion PML-e may be on an outer portion of the region LPA or may partially overlap the region LPA.

Because the center portion PML-c and the edge portion PML-e are separated from each other, transfer of the heat from the center portion PML-c to the edge portion PML-e may be prevented or reduced when the laser beam is directed to irradiate the center portion PML-c, and even when the laser beam is directed to irradiate the edge portion PML-e, thermal diffusion to the outside may be prevented or reduced because the area irradiated by the laser beam is relatively small.

Figure 8A:
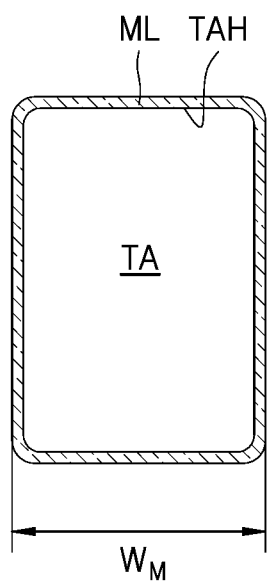
FIGS. 8A-8E are plan views of shapes of metal layers applied to embodiments.

FIG. 8A shows a shape of the metal layer ML when the preliminary metal layer PML of FIG. 7A is applied. Referring to FIG. 8A, the center portion PML-c of the preliminary metal layer PML is removed after being irradiated by the laser beam, and the metal layer ML may be provided as the edge portion PML-e or a part of the edge portion PML-e. The metal layer ML may surround an outer portion of the transmission hole TAH.

Figure 7B:
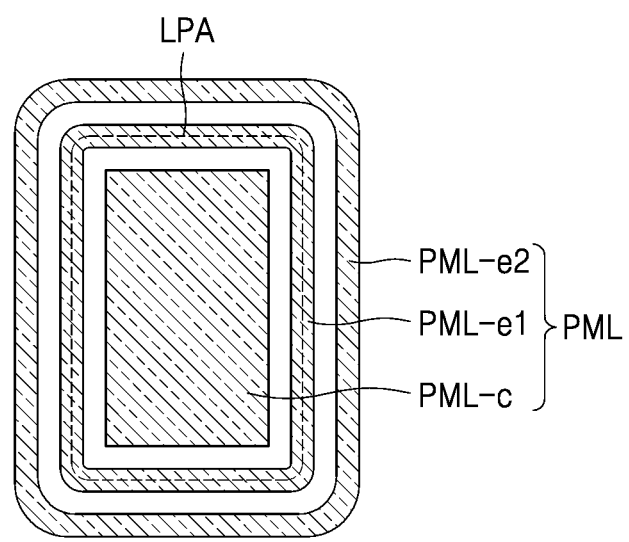

Referring to FIG. 7B, the edge portion PML-e of the preliminary metal layer PML may include a first edge portion PML-e1 and a second edge portion PML-e2. The first edge portion PML-e1 surrounds the center portion PML-c, and the second edge portion PML-e2 is separated from the first edge portion PML-e1 and surrounds the first edge portion PML-e1.

Figure 8B:
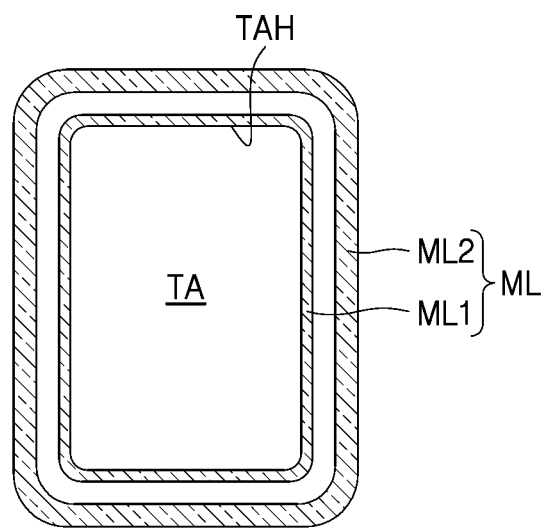

FIG. 8B shows a shape of the metal layer ML when the preliminary metal layer PML of FIG. 7B is applied. Referring to FIG. 8B, the center portion PML-c of the preliminary metal layer PML is removed after being irradiated by the laser beam, and the metal layer ML may be provided as the edge portion PML-e or a part of the edge portion PML-e. The metal layer ML may include a first metal layer ML1 and a second metal layer ML2. The first metal layer ML1 may surround an outer portion of the transmission hole TAH. The second metal layer ML2 may surround the first metal layer ML1. In some embodiments, the first metal layer ML1 may be removed and only the second metal layer ML2 may be arranged.

Figure 7C:
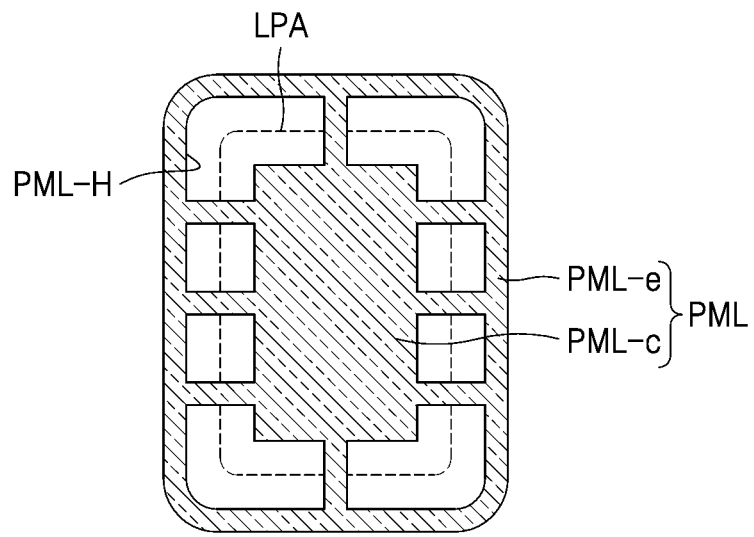

Referring to FIG. 7C, the center portion PML-c and the edge portion PML-e of the preliminary metal layer PML may be at least partially connected to each other. Alternatively, the preliminary metal layer PML may have a plurality of holes PML-H in a boundary thereof. As such, because the plurality of holes PML-H are located at the boundary, the thermal diffusion rate from the center portion PML-c to the edge portion PML-e may be reduced.

Figure 8C:
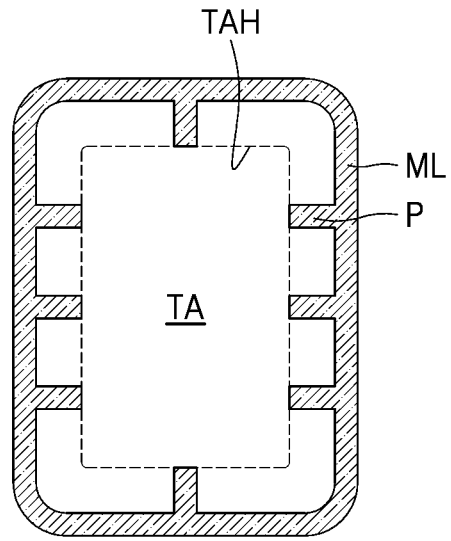

FIG. 8C shows a shape of the metal layer ML when the preliminary metal layer PML of FIG. 7C is applied. Referring to FIG. 8C, the center portion PML-c of the preliminary metal layer PML is removed after being irradiated by the laser beam, and the metal layer ML may be provided as the edge portion PML-e or a part of the edge portion PML-e. The metal layer ML may include a plurality of protrusion patterns P towards the transmission hole TAH.

Figure 7D:
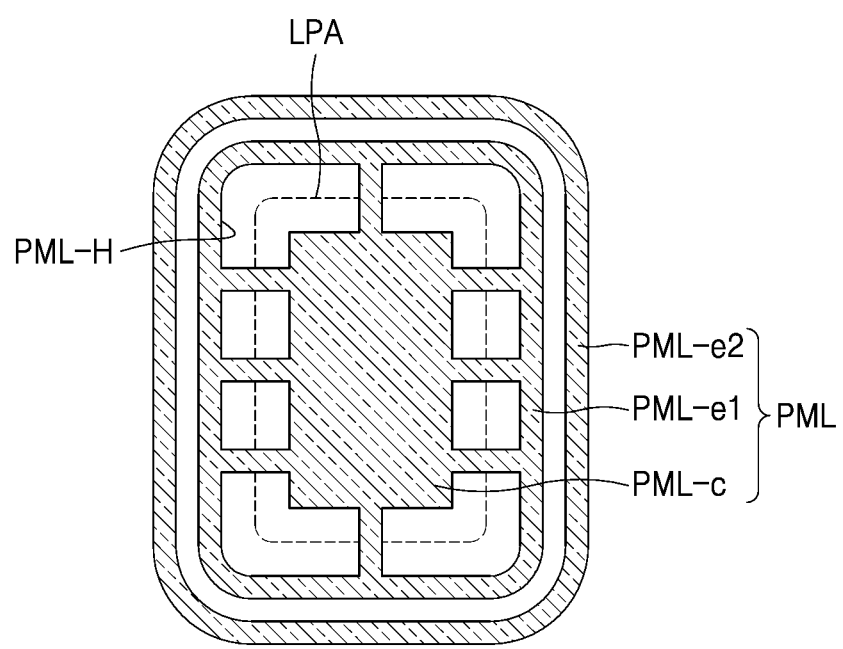

Referring to FIG. 7D, the edge portion PML-e of the preliminary metal layer PML may include a first edge portion PML-e1 and a second edge portion PML-e2. The first edge portion PML-e1 surrounds the center portion PML-c, and the second edge portion PML-e2 is separated from the first edge portion PML-e1 and surrounds the first edge portion PML-e1. Also, the first edge portion PML-e1 may be at least partially connected to the center portion PML-c.

Figure 8D:
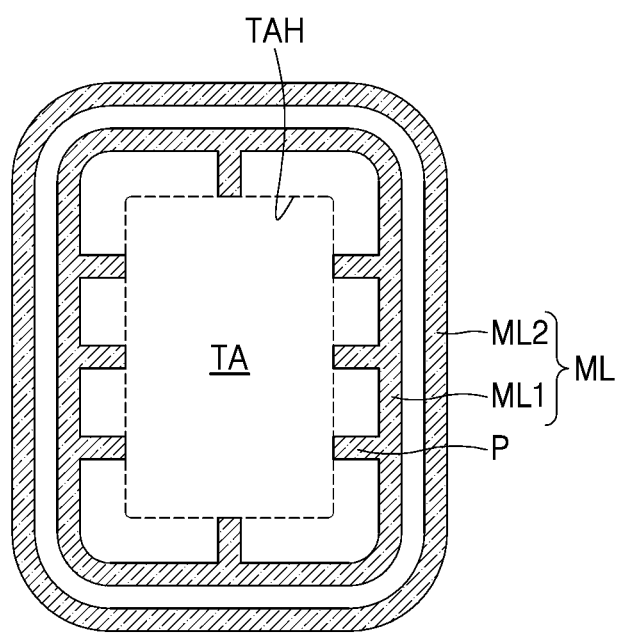

FIG. 8D shows a shape of the metal layer ML when the preliminary metal layer PML of FIG. 7D is applied. Referring to FIG. 8D, the center portion PML-c of the preliminary metal layer PML is removed after being irradiated by the laser beam, the metal layer ML may be provided as the edge portion PML-e or a part of the edge portion PML-e. The metal layer ML may include a first metal layer ML1 and a second metal layer ML2. The first metal layer ML1 may surround an outer portion of the transmission hole TAH. The second metal layer ML2 is separated from the first metal layer ML1 and may surround the first metal layer ML1. The first metal layer ML1 may include a plurality of protrusion patterns P towards the transmission hole TAH.

Figure 7E:
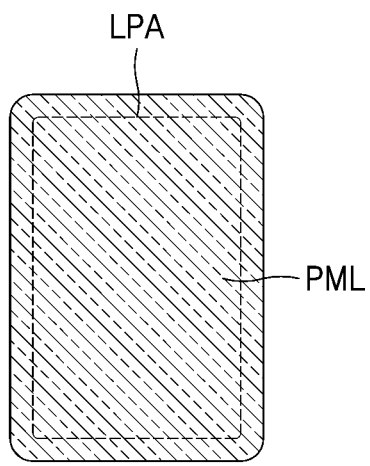

As shown in FIGS. 7A-7D, the preliminary metal layer PML may include various suitable patterns in the boundary thereof to prevent or reduce the thermal diffusion. However, one or more embodiments are not limited thereto. As shown in FIG. 7E, the center portion and the edge portion of the preliminary metal layer PML may be integrally provided. Here, the region LPA irradiated by the laser beam has an area less than that of the preliminary metal layer PML, so that the thermal diffusion to the edge of the preliminary metal layer PML may be prevented or reduced.

Figure 8E:
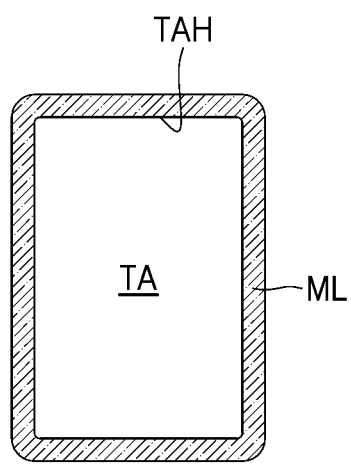

FIG. 8E shows a shape of the metal layer ML when the preliminary metal layer PML of FIG. 7E is applied. Referring to FIG. 8E, the center portion of the preliminary metal layer PML may be removed after being irradiated by the laser beam, and the metal layer ML may only include the edge of the preliminary metal layer PML. The metal layer ML may surround an outer portion of the transmission hole TAH.

Figure 9:
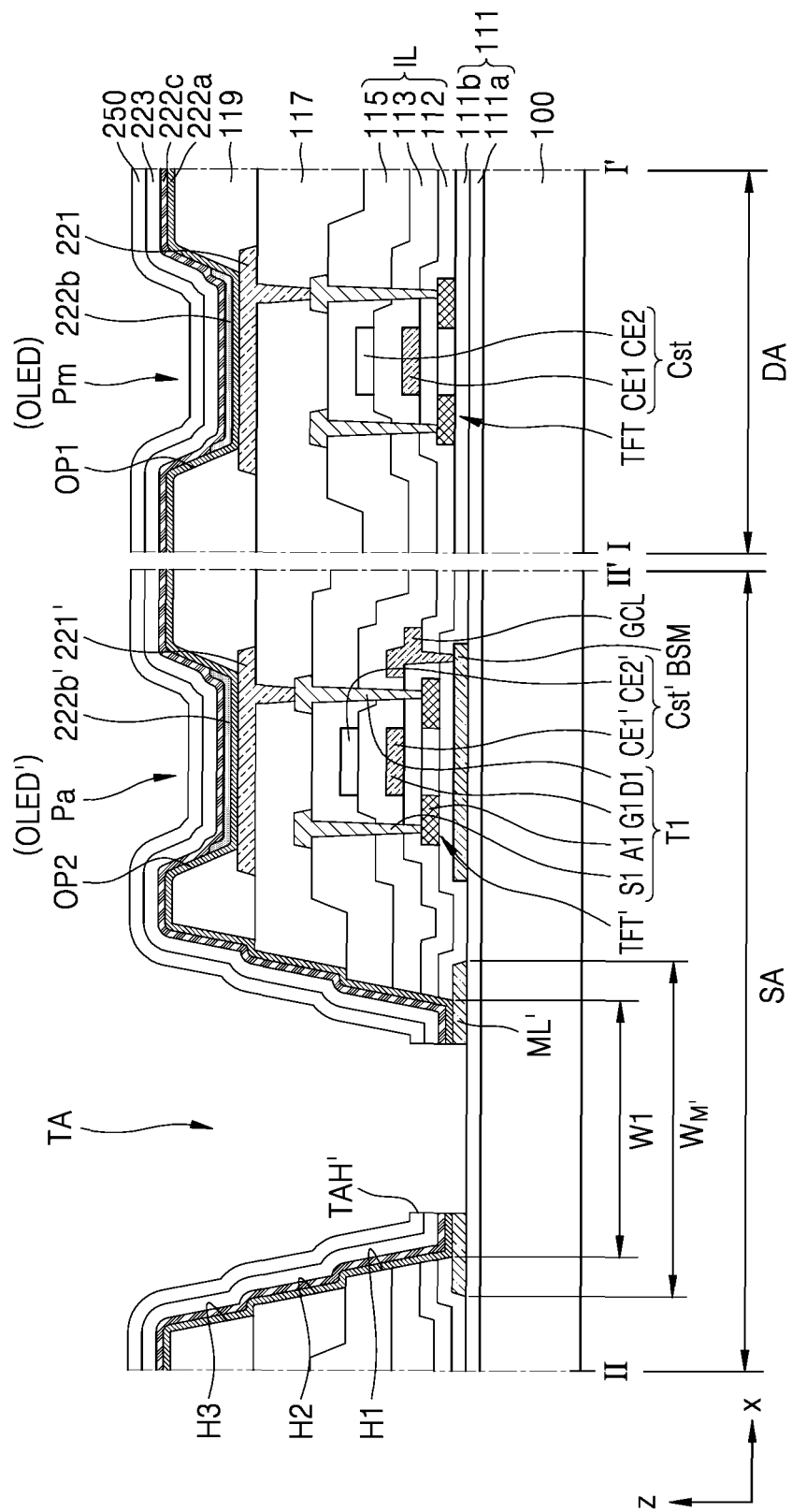
FIG. 9 is a cross-sectional view of a display apparatus according to an embodiment.

FIG. 9 is a cross-sectional view partially showing a display apparatus according to an embodiment. In FIG. 9, like reference numerals as those of FIG. 5A may denote like elements, and detailed descriptions thereof may be omitted.

Referring to FIG. 9, a metal layer ML' may be formed on the same layer by using the same material as those of the lower electrode layer BSM. In this case, a through hole TAH' may include the opening of the second buffer layer 111b, the opening of the first functional layer 222a, the opening of the second functional layer 222c, the opening of the opposite electrode 223, and the opening of the capping layer 250.

Also, the metal layer ML' may not be only arranged in the first hole H1, but may also overlap at least one of the first gate insulating layer 112, the second gate insulating layer 113, and the interlayer insulating layer 115. That is, a width WM' of the metal layer ML' (as shown in FIG. 9) may be greater than the width W1 of the first hole H1.

Figure 10A:
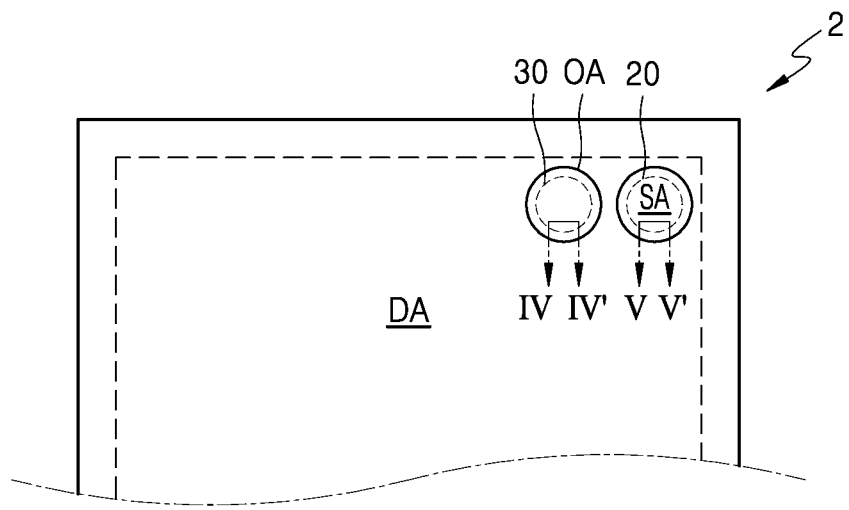
FIG. 10A is a plan view of a display apparatus according to an embodiment.
Figure 10B:
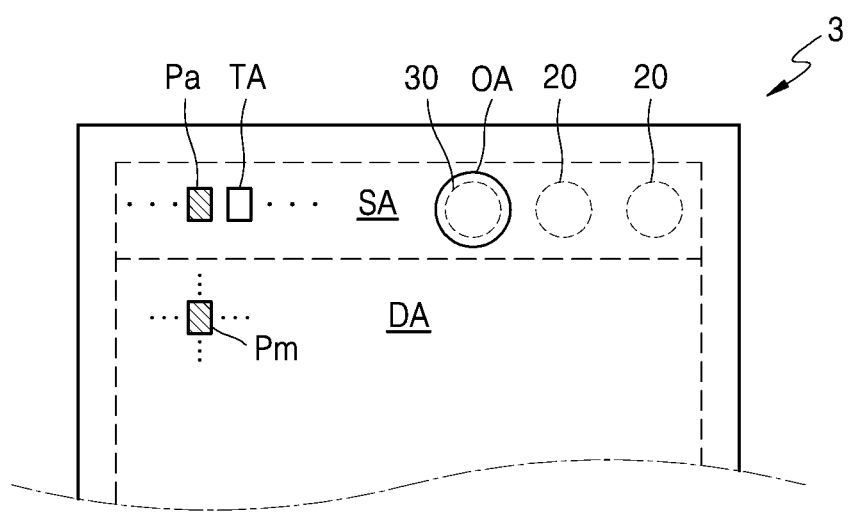
FIG. 10B is a plan view of a display apparatus according to an embodiment.

FIGS. 10A-10B are plan views partially showing a display apparatus 2 and 3 according to embodiments.

Referring to FIG. 10A, the display apparatus 2 may further include an opening area OA.

A component 30 may be arranged under the opening area OA. The opening area OA may be considered as a transmission portion through which light and/or sound output from the component 30 or proceeding towards the component 30 may pass from the outside. In an embodiment, when the light transmits through the opening area OA, a light transmittance may be about 20% or greater, about 50% or greater, about 75% or greater, about 80% or greater, about 85% or greater, or about 90% or greater. The opening area OA is a region where a display element is not arranged, and may not provide images. In the embodiment, the opening area OA is arranged in the display area DA and main pixels may be arranged surrounding the opening area OA.

The component 20 may be arranged under the sensor area SA. Because the auxiliary pixels are arranged in the sensor area SA, the sensor area SA may provide images.

In some embodiments, a light transmittance of the opening area OA may be greater than that of the sensor area SA. Accordingly, the component 30 requiring high light transmittance (e.g., a camera, etc.) may be arranged in the opening area OA, and a sensor for sensing IR may be arranged in the sensor area SA.

Referring to FIG. 10B, the sensor area SA of a display apparatus 3 includes a region where the component 20 is arranged and may be arranged at a side of the display area DA. The sensor area SA may be arranged corresponding to one side of the display area DA, and a plurality of components 20 may be arranged in the sensor area SA.

Also, the sensor area SA includes the auxiliary pixels Pa and the transmission portion TA, and thus, may provide an image having a resolution lower than that of the image displayed by the display area DA.

The sensor area SA may include the opening area OA therein. The opening area OA may have a higher light transmittance as compared with the sensor area SA, and may include the component 30 that is highly sensitive to light. The opening area OA may be surrounded by the auxiliary pixels Pa and the transmission portion TA. The opening area OA may have an area that is greater than that of the transmission portion TA.

Figure 11:
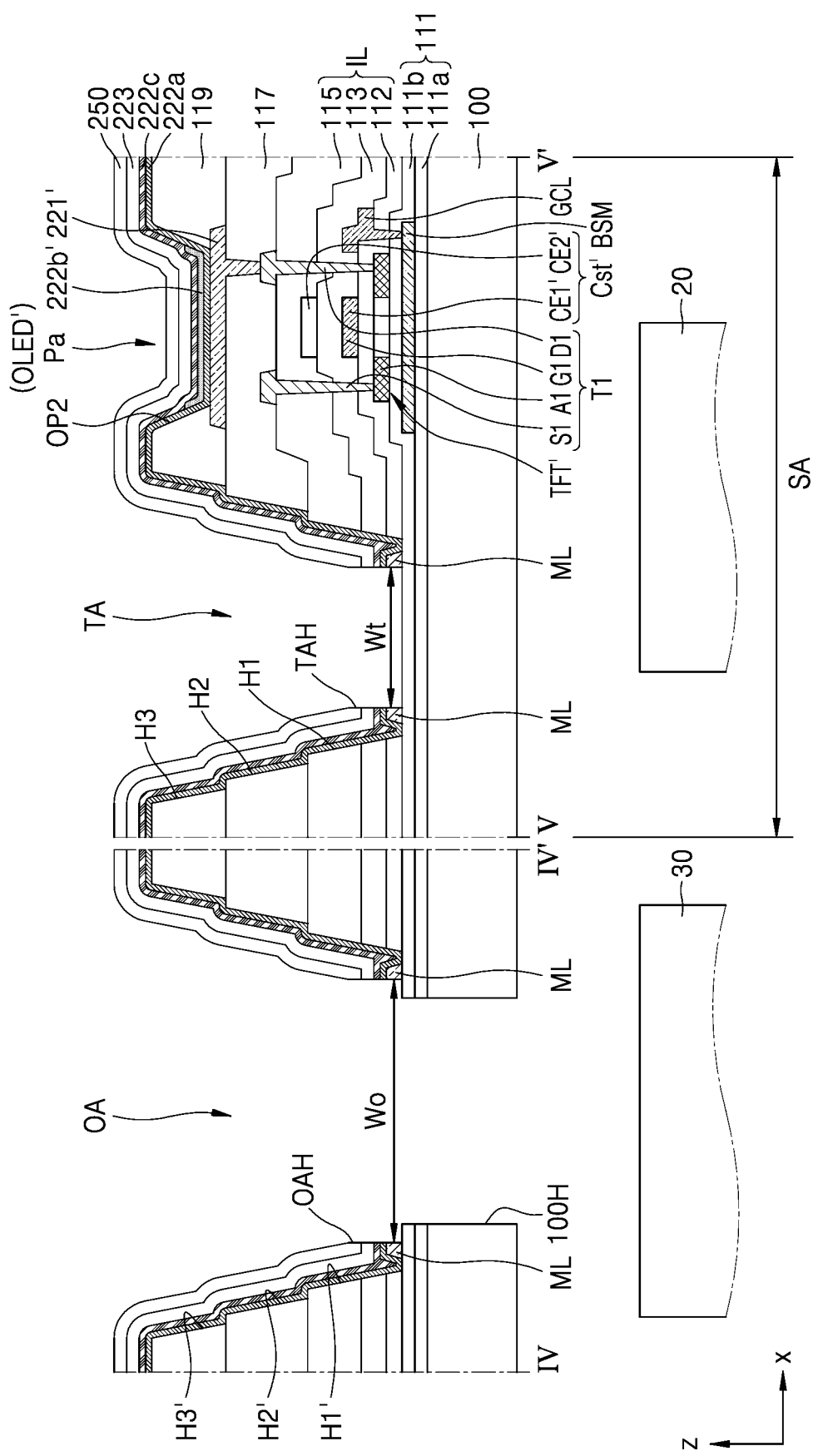
FIG. 11 is a cross-sectional view of a display apparatus taken along the line IV-IV' and the line V-V of FIG. 10A.

FIG. 11 is a cross-sectional view taken along the line IV-IV' and the line V-V' of FIG. 10A. In FIG. 11, like reference numerals as those of FIG. 5A may denote like elements, and detailed descriptions thereof may be omitted.

Referring to FIG. 11, the display apparatus may include the opening area OA. The opening area has an opening hole OAH corresponding to the opening area OA, and an additional metal layer ML" may be arranged on an outer portion of the opening hole OAH. The additional metal layer ML" may at least partially surround the opening area OA or the opening hole OAH.

The additional metal layer ML" is provided to form the opening hole OAH, and performs the same functions as those of the metal layer ML. The display apparatus may further include a first additional hole H1' corresponding to the opening area of the inorganic insulating layer IL, and the first additional hole H1' may overlap the opening hole OAH. The additional metal layer ML" may be arranged in the first additional hole H1'. Structures of the opening hole OAH and periphery thereof may be similar to those of the transmission hole TAH and periphery thereof.

A width Wo of the opening hole OAH may be greater than the width Wt of the transmission hole TAH. The opening hole OAH may overlap the entire component 30, whereas the transmission hole TAH may partially overlap the component 20.

In the opening area OA, a substrate hole 100H penetrating through the substrate 100 may be provided. Because the opening area OA includes the substrate hole 100H, the light transmittance of the opening area OA may be greater than that of the sensor area SA. Accordingly, the component 30 requiring high light transmittance may be arranged under the opening area OA.

According to the display apparatus of the embodiments, a pixel portion and a transmission portion having an improved light transmittance are arranged in the sensor area corresponding to a component such as a sensor, etc., and thus, an image may be realized on a region overlapping the component concurrently (e.g., simultaneously) with providing an environment in which the component may operate.

It should be understood that embodiments described herein should be considered in a descriptive sense only and not for purposes of limitation. Descriptions of features or aspects within each embodiment should typically be considered as available for other like features or aspects in other embodiments.

While one or more embodiments have been described with reference to the figures, it will be understood by those of ordinary skill in the art that various suitable changes in form and details may be made therein without departing from the spirit and scope as defined by the following claims, and equivalents thereof.

What is claimed is:

1. A display apparatus comprising:
a substrate comprising a display area and a sensor area, wherein the display area comprises main pixels and the sensor area comprises auxiliary pixels and a transmission portion;
a first pixel electrode and a first emission layer in each of the main pixels;
a second pixel electrode and a second emission layer in each of the auxiliary pixels;
an opposite electrode integrally arranged in the display area and the sensor area; and
a metal layer at least partially surrounding the transmission portion,
wherein the opposite electrode has an opening corresponding to the transmission portion.

2. The display apparatus of claim 1, further comprising:
an inorganic insulating layer on the substrate,
wherein the inorganic insulating layer has a first hole corresponding to the transmission portion, and
the opposite electrode is on a side wall of the first hole.

3. The display apparatus of claim 2, wherein the metal layer is in the first hole.

4. The display apparatus of claim 2, wherein the opening in the opposite electrode has an area that is less than an area of the first hole.

5. The display apparatus of claim 1, further comprising:
a functional layer integrally provided in the display area and the sensor area, the functional layer being between the first pixel electrode and the opposite electrode and having an opening corresponding to the transmission portion,
wherein the opening of the opposite electrode and the opening of the functional layer overlap each other and form a through hole.

6. The display apparatus of claim 1, wherein the metal layer comprises same material as the first pixel electrode.

7. The display apparatus of claim 1, wherein the metal layer comprises a first metal layer surrounding the transmission portion and a second metal layer separated from the first metal layer, the second metal layer at least partially surrounding the first metal layer.

8. The display apparatus of claim 1, wherein the metal layer comprises a protrusion extending towards the transmission portion.

9. The display apparatus of claim 1, further comprising:
a lower electrode layer in the sensor area,
wherein the lower electrode layer is between the substrate and an auxiliary thin film transistor in the auxiliary pixel.

10. The display apparatus of claim 9, wherein the metal layer comprises a same material as the lower electrode layer.

11. The display apparatus of claim 9, further comprising:
an inorganic insulating layer on the substrate,
wherein the inorganic insulating layer has a first hole corresponding to the transmission portion, and
the metal layer has a width greater than a width of the first hole.

12. The display apparatus of claim 1, further comprising:
a component on a lower surface of the substrate, the component corresponding to the sensor area.

13. The display apparatus of claim 1, wherein the substrate further comprises an opening area surrounded by the display area, and an additional metal layer surrounding the opening area.

14. The display apparatus of claim 13, wherein the substrate has a substrate hole corresponding to the opening area.

15. A method of manufacturing a display apparatus comprising a substrate comprising a display area and a sensor area, the display area comprising main pixels and the sensor area comprising auxiliary pixels and a transmission portion, the method comprising:
forming a preliminary metal layer on an upper surface of the substrate, the preliminary metal layer overlapping the transmission portion;
forming an opposite electrode on the preliminary metal layer;
directing a laser beam to irradiate the preliminary metal layer from a lower surface of the substrate; and
lifting off the preliminary metal layer, irradiated by the laser beam, from the substrate,
wherein the preliminary metal layer has a pattern at an edge thereof.

16. The method of claim 15, wherein the preliminary metal layer comprises a center portion and an edge portion separated from the center portion, the edge portion surrounding the center portion.

17. The method of claim 16, wherein the center portion is at least partially connected to the edge portion.

18. The method of claim 16, wherein the edge portion comprises a first edge portion and a second edge portion, the first edge portion being separated from the second edge portion.

19. The method of claim 18, wherein the first edge portion is at least partially connected to the center portion.

20. The method of claim 15, wherein the laser beam comprises an infrared ray.

* * * * *